US009178156B2

(12) United States Patent
James et al.

(10) Patent No.: US 9,178,156 B2
(45) Date of Patent: Nov. 3, 2015

(54) COMPOSITIONS COMPRISING POLYMERIC BINDERS

(75) Inventors: Mark James, Romsey (GB); Magda Goncalves-Miskiewicz, Southampton (GB); Philip Edward May, Sidcup (GB); Lana Nanson, Southampson (GB); Ruth Effenberger, Undenheim (DE); Klaus Bonrad, Alsbach-Haehnlein (DE); Junyou Pan, Frankfurt am Main (DE); Edgar Kluge, Gross-Gerau (DE)

(73) Assignee: Merck Patent GmbH (DE)

( * ) Notice: Subject to any disclaimer, the term of this patent is extended or adjusted under 35 U.S.C. 154(b) by 477 days.

(21) Appl. No.: 13/518,053

(22) PCT Filed: Nov. 24, 2010

(86) PCT No.: PCT/EP2010/007132
§ 371 (c)(1),
(2), (4) Date: Jun. 21, 2012

(87) PCT Pub. No.: WO2011/076325
PCT Pub. Date: Jun. 30, 2011

(65) Prior Publication Data
US 2012/0273736 A1 Nov. 1, 2012

(51) Int. Cl.
| H01L 51/00 | (2006.01) |
| C08G 59/50 | (2006.01) |
| C08G 59/56 | (2006.01) |
| C08L 63/00 | (2006.01) |
| C09D 5/24 | (2006.01) |
| C09D 7/12 | (2006.01) |
| C09D 11/03 | (2014.01) |
| C09D 11/52 | (2014.01) |
| H05B 33/20 | (2006.01) |
| C09B 57/00 | (2006.01) |
| C09B 57/10 | (2006.01) |
| C09B 1/00 | (2006.01) |
| C08K 5/00 | (2006.01) |
| C08K 5/56 | (2006.01) |
| H01L 51/50 | (2006.01) |

(52) U.S. Cl.
CPC ............ *H01L 51/0005* (2013.01); *C08G 59/50* (2013.01); *C08G 59/56* (2013.01); *C08L 63/00* (2013.01); *C09B 1/00* (2013.01); *C09B 57/00* (2013.01); *C09B 57/008* (2013.01); *C09B 57/10* (2013.01); *C09D 5/24* (2013.01); *C09D 7/1233* (2013.01); *C09D 11/03* (2013.01); *C09D 11/52* (2013.01); *H01L 51/0007* (2013.01); *H05B 33/20* (2013.01); *C08K 5/0041* (2013.01); *C08K 5/0091* (2013.01); *C08K 5/56* (2013.01); *H01L 51/5016* (2013.01); *Y02E 10/549* (2013.01)

(58) Field of Classification Search
CPC . H01L 51/00; H01L 51/0035; H01L 51/0067; C09K 11/02; C09K 11/06; C09D 5/24; C09D 11/02; H01B 1/12

USPC ............... 252/519.34, 519.3, 519.21, 301.35, 252/500; 257/E51.026; 438/99
See application file for complete search history.

(56) References Cited

U.S. PATENT DOCUMENTS

| 4,539,507 | A | * | 9/1985 | VanSlyke et al. ............. 313/504 |
| 5,965,281 | A | | 10/1999 | Cao |
| 8,974,702 | B2 | * | 3/2015 | May et al. ..................... 252/500 |
| 2004/0188672 | A1 | | 9/2004 | Spreitzer et al. |
| 2006/0127696 | A1 | * | 6/2006 | Stossel et al. ................. 428/690 |
| 2006/0257686 | A1 | | 11/2006 | Shimizu et al. |
| 2007/0176544 | A1 | * | 8/2007 | Koike et al. ................... 313/504 |
| 2007/0249087 | A1 | | 10/2007 | Zhu et al. |
| 2010/0176377 | A1 | | 7/2010 | Fukushima et al. |
| 2010/0213455 | A1 | * | 8/2010 | James et al. ..................... 257/40 |
| 2012/0056169 | A1 | * | 3/2012 | Kaiser et al. .................... 257/40 |
| 2012/0056170 | A1 | * | 3/2012 | Pan et al. ........................ 257/40 |
| 2012/0061617 | A1 | * | 3/2012 | Heun et al. ................ 252/301.35 |
| 2012/0068170 | A1 | * | 3/2012 | Pflumm et al. .................. 257/40 |
| 2012/0104380 | A1 | * | 5/2012 | James et al. ..................... 257/40 |
| 2012/0228554 | A1 | * | 9/2012 | Franz et al. .................... 252/500 |
| 2012/0238105 | A1 | * | 9/2012 | Anemian et al. .............. 438/758 |
| 2012/0256137 | A1 | * | 10/2012 | James et al. ................... 252/500 |
| 2012/0273736 | A1 | * | 11/2012 | James et al. ............. 252/519.21 |
| 2013/0026415 | A1 | * | 1/2013 | James et al. ............. 252/301.16 |
| 2013/0026421 | A1 | * | 1/2013 | James et al. ................... 252/500 |
| 2013/0069020 | A1 | * | 3/2013 | May et al. ................ 252/519.21 |

(Continued)

FOREIGN PATENT DOCUMENTS

| DE | 10123115 A1 | 11/2002 |
| EP | 1837928 A1 | 9/2007 |

(Continued)

OTHER PUBLICATIONS

Tae-Ho Kim et al., "Enhanced electrophosphorescence via highly efficient energy transfer from conjugated polymer", Applied Physics Letters, 86, 171108 (2005).*
Do-Hoon Hwang et al., "Synthesis of a New Polymeric Host Material for Efficient Organic Electro-Phosphorescent Devices", Journal of Nanoscience and Nanotechnology, 8, 4649-4652, 2008.*
Search Report for European Application No. 13006055.1 mailed Mar. 27, 2014.
Lee, et al., "White Light Emitting Electrophosphorescent Devices with Solution Processed Emission Layer", Japanese Journal of Applied Physics, vol. 45, No. 12, (2006), pp. 9231-9233.

(Continued)

*Primary Examiner* — Douglas MC Ginty
(74) *Attorney, Agent, or Firm* — Drinker Biddle & Reath LLP

(57) ABSTRACT

The present invention relates to novel compositions comprising light emitting materials and/or charge transport materials and a polymeric binder, to their use as conducting inks for the preparation of organic light emitting diode (OLED) devices, to methods for preparing OLED devices using the novel formulations, and to OLED devices prepared from such methods and formulations.

17 Claims, 2 Drawing Sheets

(56) References Cited

U.S. PATENT DOCUMENTS

Figure 1:
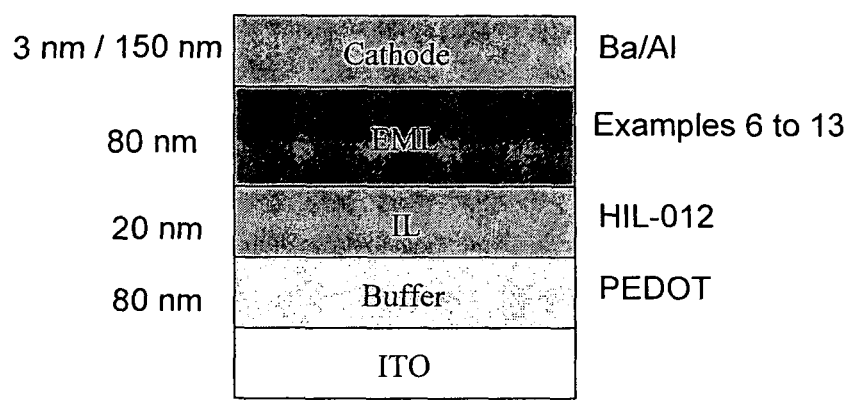

2013/0161594 A1* 6/2013 James et al. .................. 257/40
2014/0048745 A1* 2/2014 Anemian et al. ............. 252/500

FOREIGN PATENT DOCUMENTS

| | | |
|---|---|---|
| JP | 2000-252072 A | 9/2000 |
| JP | 2000-323276 A | 11/2000 |
| JP | 2006-318781 A | 11/2006 |
| JP | 2007504272 | 3/2007 |
| JP | 2007162009 A | 6/2007 |
| WO | WO-2004/101707 A1 | 11/2004 |
| WO | WO-2009049744 A1 | 4/2009 |
| WO | WO-2009109273 A1 | 9/2009 |
| WO | WO-2009/151978 A1 | 12/2009 |
| WO | WO-2009151978 A1 | 12/2009 |
| WO | WO-2010149259 A2 | 12/2010 |

OTHER PUBLICATIONS

International Search Report for PCT/EP2010/007132 mailed Apr. 5, 2011.
U.S. Appl. No. 13/518,069, filed Jun. 21, 2012, Mark James et al.
Japanese Office Action mailed on Sep. 9, 2014 for Japanese Patent Application No. 2012-545117.

* cited by examiner

Lifetime curves from examples 12 and 13 (table 3)

COMPOSITIONS COMPRISING POLYMERIC BINDERS

RELATED APPLICATIONS

This application is a national stage application (under 35 U.S.C. §371) of PCT/EP2010/007132, filed Nov. 24, 2010, which claims benefit of European Patent Application No. 09015911.2, filed Dec. 23, 2009.

FIELD OF THE INVENTION

The present invention relates to novel compositions comprising light emitting materials and/or charge transport materials and a polymeric binder, to their use as inks for the preparation of organic light emitting diode (OLED) devices, to methods for preparing OLED devices using the novel compositions, and to OLED devices prepared from such methods and compositions.

BACKGROUND AND PRIOR ART

When preparing OLED devices usually printing techniques like inkjet printing, roll to roll printing, slot dye coating or gravure printing are used to apply the active layer. Based on low solubility of the most of the present organic compounds useful as emitting materials and/or charge transport materials, these techniques need the use of solvents in high amounts.

In order to improve the film forming ability binding agents can be used. These additives are especially needed with regard to light emitting materials and/or charge transport materials having small molecular weight or polymeric compounds having a low molecular weight.

EP 1 883 124 A1 describes a formulation of light-emitting material particularly suitable for forming displays and lamps via printing techniques comprising organic-light emitting material housed in protective porous matrix material, a binder and a solvent. However, the OLED material encompasses also polymeric materials. Furthermore, the binder material is disclosed as a long list without any detailed specification.

US 2007/0103059 discloses compositions comprising an OLED material and a polymer having very specific repeating units. The polymer having specific repeating units is added to improve the emitting efficiency of the OLED. Also polymeric OLED materials can be employed.

According to U.S. Pat. No. 6,818,919 and U.S. Pat. No. 7,115,430 polymers having a high glass transition temperature $T_g$ have to be used in order to process low molecular weight organic light emitting and charge transport materials. However, these materials are expensive and limit the application of the compositions.

U.S. Pat. No. 5,952,778 relates to an encapsulated organic light emitting device having an improved protective covering comprising a first layer of passivating metal, a second layer of an inorganic dielectric material and a third layer of polymer. The organic light emitting material can be polymeric or monomeric. The composition can contain a polymer binder. However, the binder material is disclosed in a long list without any detailed specification.

U.S. Pat. No. 6,277,504 B1 discloses specific light emitting compounds and compositions comprising the same. The compositions may include a binder. However, no detailed specification of the binder is provided.

U.S. Pat. No. 6,294,273 B1 describes light emitting compounds being soluble in methanol. The compositions comprising these compounds may contain polymer binders. However, the binder material is disclosed in a long list without any detailed specification.

WO 2005/055248 A2 relates to compositions comprising specific organic semiconductor compounds and an organic binder having a permittivity of 3.3 or less at 1000 Hz. However, the specific organic semiconductor compounds as disclosed in WO 2005/055248 A2 should form a layer having a high crystallinity in order to achieve a high efficiency. In contrast thereto, layers emitting light should usually have a low crystallinity for providing high efficiency. Therefore, the concept of WO 2005/055248 A2 cannot be applied to OLED layers.

Solutions of small molecules in a solvent do not generally have a big effect on the viscosity of the resultant solution as occurs with polymers. Therefore, compositions of small molecules for conventional printing applications like ink jet printing, flexographic or gravure printing need additives to increase ink viscosity and improve film formation. The prior art provides compositions being useful in order to process low molecular weight organic light emitting and charge transport materials. However, it is a permanent desire to improve the performance of the OLED layer, especially in terms of efficiency, lifetime and sensitivity regarding oxidation or water.

It is therefore desirable to have fluids comprising light emitting materials and/or charge transport materials that are suitable for the preparation of OLED devices by the aforementioned solution based processes, which allow the manufacture of very homogeneous OLED devices having a high efficiency, a long lifetime, and a low sensitivity against water or oxidation. One aim of the present invention is to provide such improved fluids. Another aim is to provide improved methods of preparing an OLED device from such fluids. Another aim is to provide improved OLED devices obtained from such fluids and methods. Further aims are immediately evident to the person skilled in the art from the following description.

Surprisingly it has been found that these aims can be achieved, and the above-mentioned problems can be solved, by providing methods, materials and devices as claimed in the present invention, especially by providing a process for preparing an OLED device using a composition comprising a polymeric binder.

SUMMARY OF THE INVENTION

The invention relates to a composition comprising one or more organic light emitting materials and/or charge transport materials having a molecular weight of at most 5000 g/mol, one or more organic solvents, and one or more polymers, characterized in that said polymer is an inert binder.

The invention further relates to the use of a formulation as described above and below as coating or printing ink for the preparation of OLED devices, in particular for rigid and flexible OLED devices.

The invention further relates to a process of preparing an organic light emitting diode (OLED) device, comprising the steps of
a) depositing a composition as described above and below onto a substrate, preferably to form a film or layer, and
b) removing the solvent(s), for example by evaporation.

The invention further relates to an OLED device prepared from a formulation and/or by a process as described above and below.

OLED devices can for example be used for illumination, for medical illumination purposes, as signalling device, as signage devices, and in displays. Displays can be addressed using passive matrix driving, total matrix addressing or active matrix driving. Transparent OLEDs can be manufactured by using optically transparent electrodes. Flexible OLEDs are assessable through the use of flexible substrates.

The compositions, methods and devices of the present invention provide surprising improvements in the efficiency of the OLED devices and the production thereof. Unexpectedly, the performance, the lifetime and the efficiency of the OLED devices can be improved, if these devices are achieved by using a composition of the present invention. Furthermore, the composition of the present invention provides an astonishingly high level of film forming. Especially, the homogeneity and the quality of the films can be improved. In addition thereto, the present invention enables better solution printing of multi layer devices.

A BRIEF DESCRIPTION OF THE FIGURES

Figure 2:
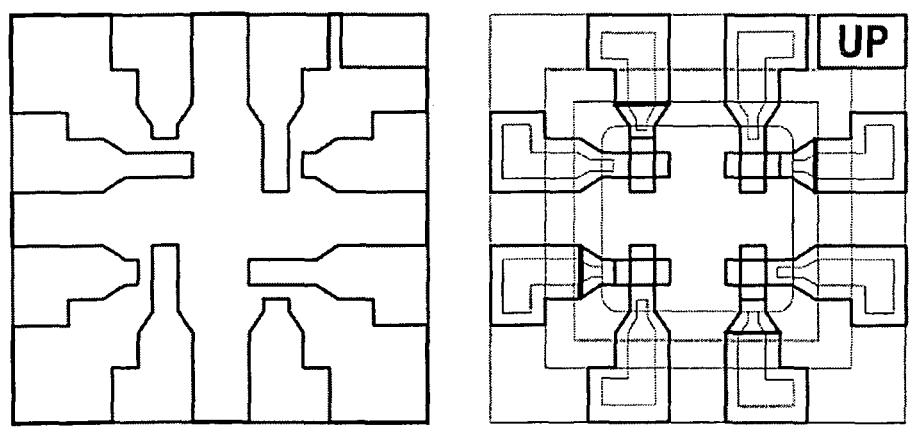
Figure 3:
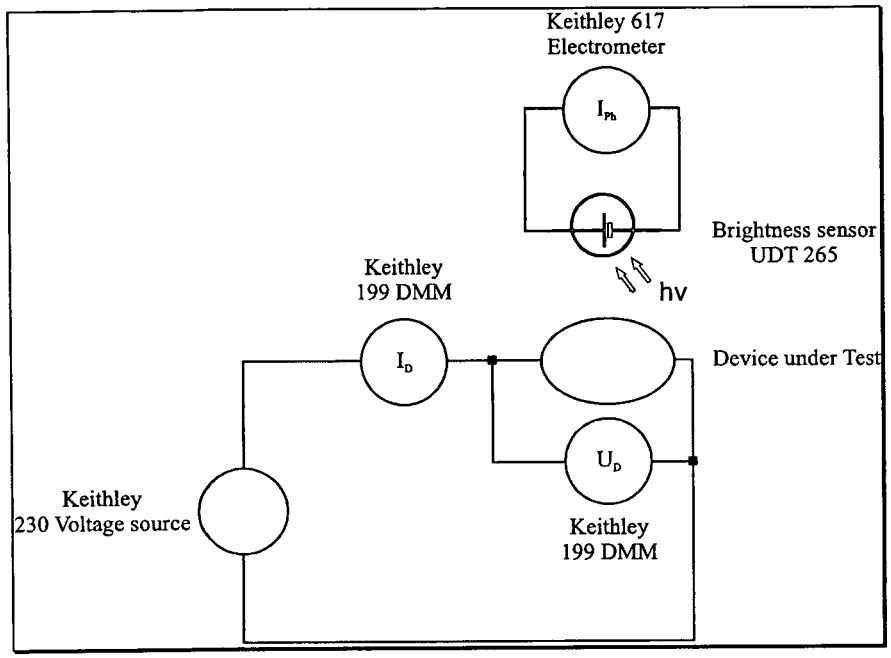
Figure 4:
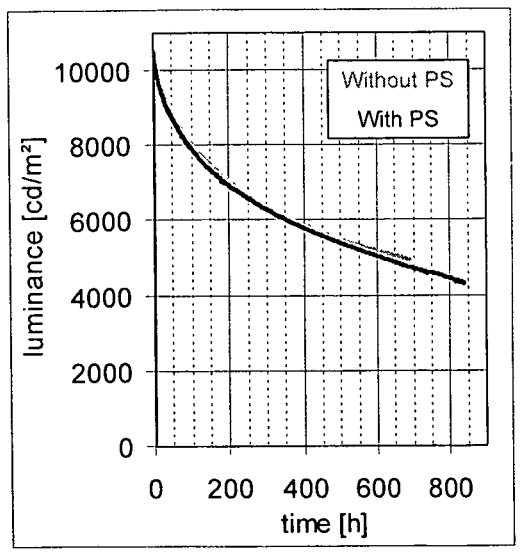

FIG. 1 illustrates the typical setup.
FIG. 2 illustrates the device layout.
FIG. 3 illustrates the setup that does the characterization.
FIG. 4 shows the lifetime curves for the devices of examples 12 and 13.

DETAILED DESCRIPTION OF THE INVENTION

The organic light emitting materials and/or charge transport materials can be selected from standard materials known to the skilled person and described in the literature having a molecular weight of at most 5000 g/mol. Preferably, the composition comprises an organic light emitting material. Organic light emitting material according to the present application means a material which emits light having a $\lambda_{max}$ in the range from 300 to 800 nm.

The composition according to the present invention can comprise between 0.01 and 20% by weight, preferably between 0.1 and 15% by weight, more preferably between 0.2 and 10% by weight and most preferably between 0.25 and 5% by weight, of the organic light emitting materials and/or charge transport materials or the corresponding blend. The percent data relate to 100% of the solvent or solvent mixture.

The light emitting material or the charge transport material (below together named as organic semiconductor) used here is either a pure component or a mixture of two or more components. The organic light emitting materials and/or charge transport materials preferably include phosphorescent compounds.

Suitable phosphorescent compounds are, in particular, compounds which emit light, preferably in the visible region, on suitable excitation and in addition contain at least one atom having an atomic number greater than 20, preferably greater than 38 and less than 84, more preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium or platinum.

Particularly preferred organic phosphorescent compounds are compounds of formulae (1) to (4):

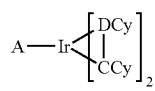

formula (1)

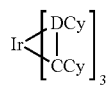

formula (2)

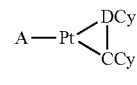

formula (3)

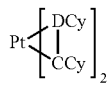

formula (4)

where
DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;
CCy is, identically or differently on each occurrence, a cyclic group which contains a carbon atom via which the cyclic group is bonded to the metal and which may in turn carry one or more substituents $R^1$;
A is, identically or differently on each occurrence, a monoanionic, bidentate chelating ligand, preferably a diketonate ligand;
$R^1$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^2$—, —$CONR^2$—, —CO—O—, —C=O—, —CH=CH— or and in which one or more hydrogen atoms may be replaced by F, or an aryl or heteroaryl group which has from 4 to 14 carbon atoms and may be substituted by one or more nonaromatic $R^1$ radicals, and a plurality of substituents $R^1$, either on the same ring or on the two different rings, may together in turn form a mono- or polycyclic, aliphatic or aromatic ring system; and
$R^2$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —CH=O—, —CH=CH— or —C=C C—, and in which one or more hydrogen atoms may be replaced by F, or an aryl or heteroaryl group which has from 4 to 14 carbon atoms and may be substituted by one or more nonaromatic $R^1$ radicals.

Formation of ring systems between a plurality of radicals $R^1$ means that a bridge may also be present between the groups DCy and CCy. Furthermore, formation of ring systems between a plurality of radicals $R^1$ means that a bridge may also be present between two or three ligands CCy-DCy or between one or two ligands CCy-DCy and the ligand A, giving a polydentate or polypodal ligand system.

Examples of the emitters described above are revealed by the applications WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973 and DE 102008027005. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, it is known to the person skilled in the art which phosphorescent complexes emit with which emission colour.
Examples of preferred phosphorescent compounds are shown in the following table.
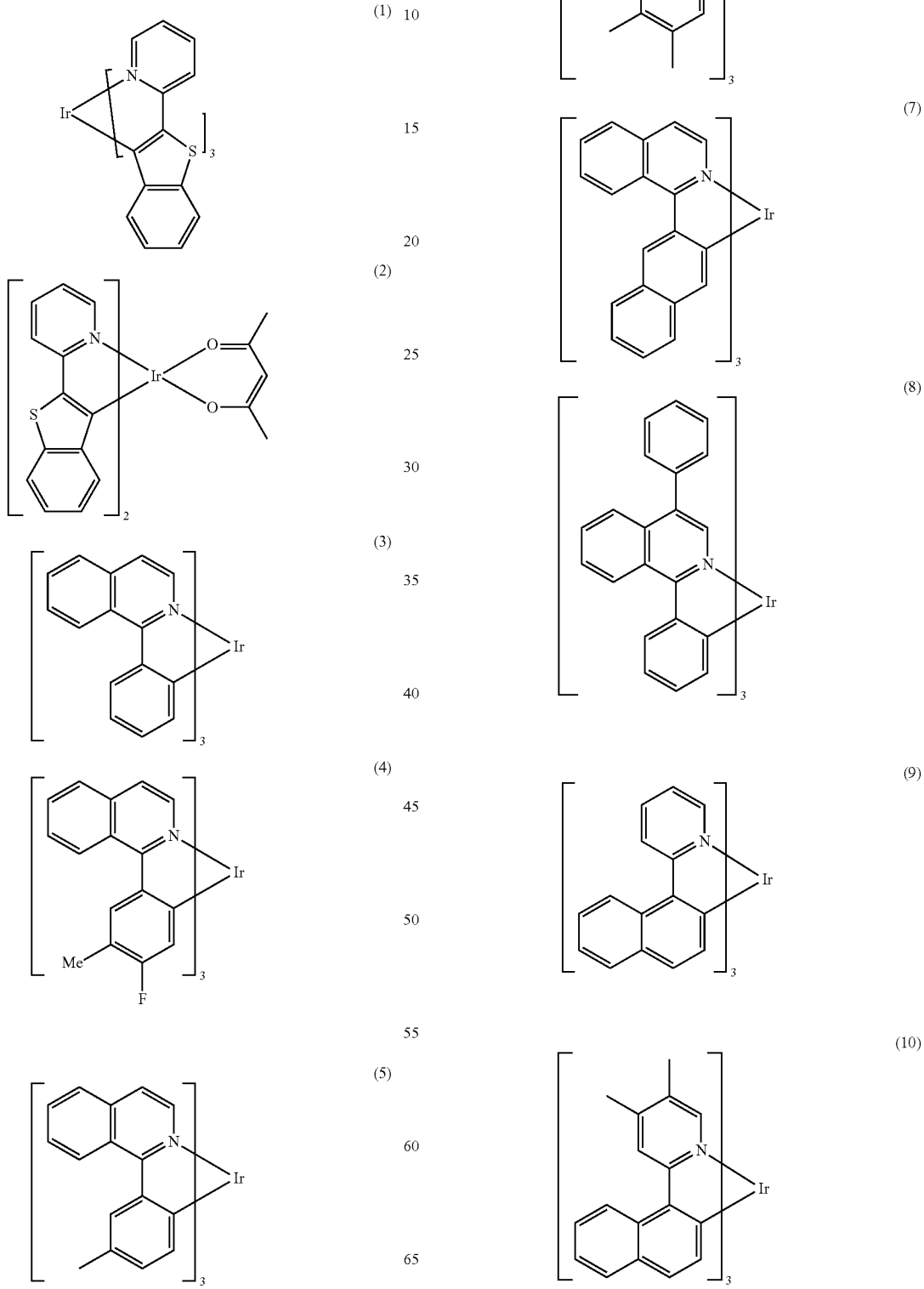

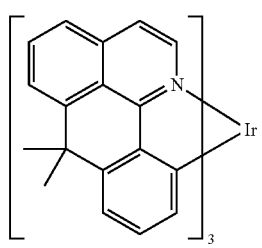
(11)
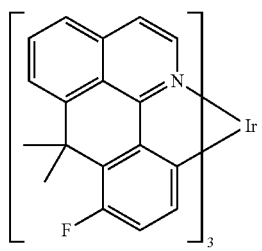
(12)
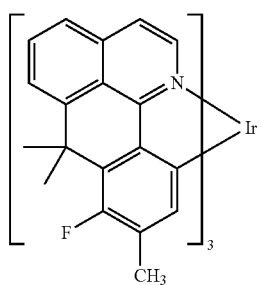
(13)
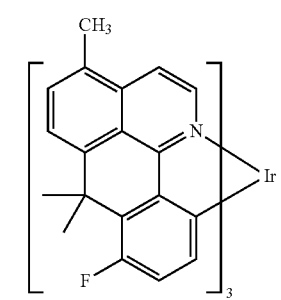
(14)
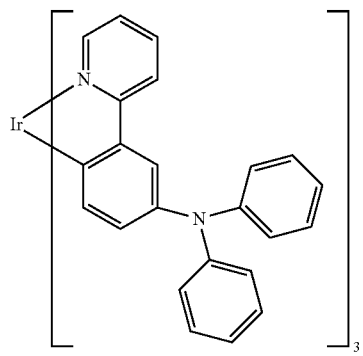
(15)
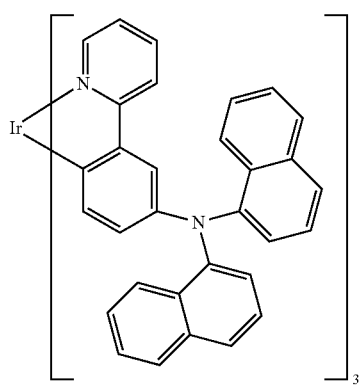
(16)
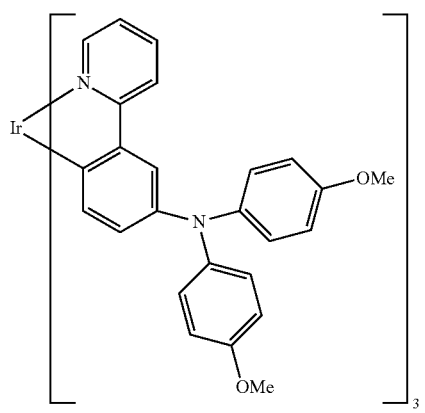
(17)
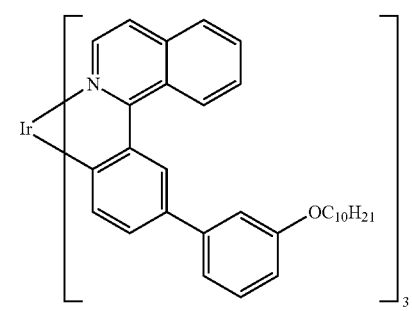
(18)
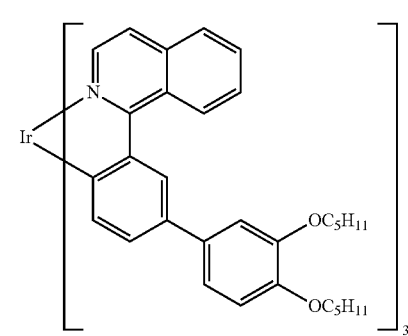
(19)

(20)
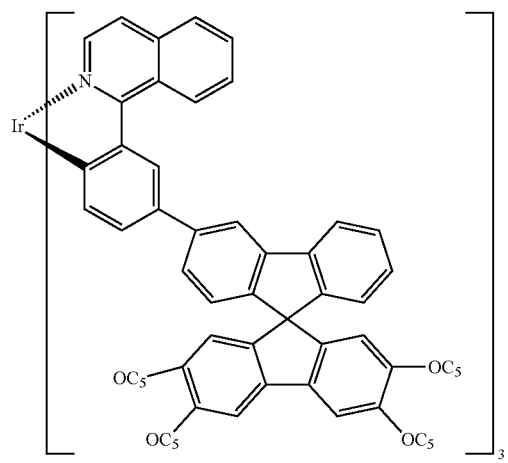
(21)
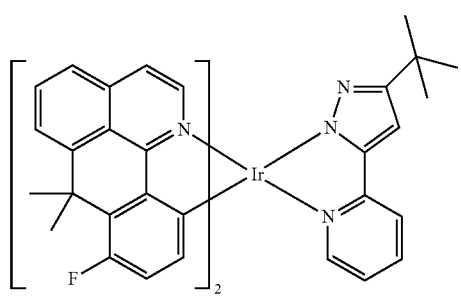
(22)
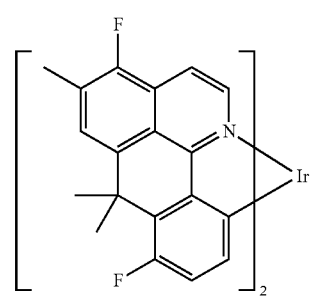
(23)
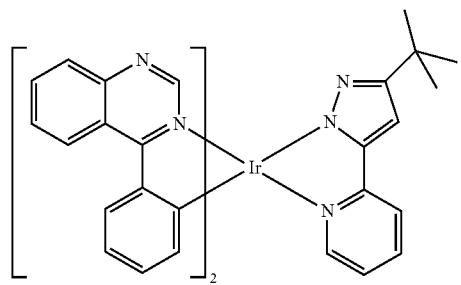
(24)
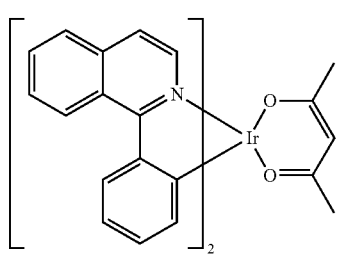
(25)
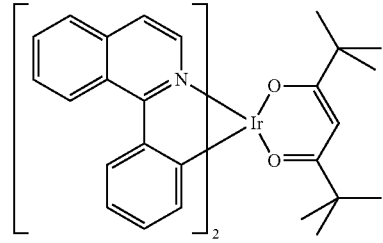
(26)
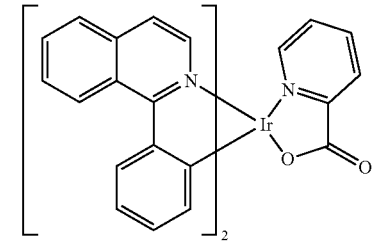
(27)
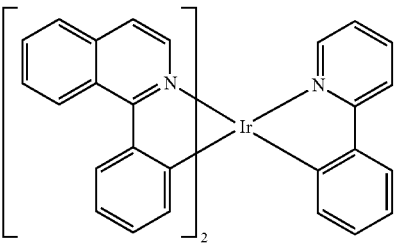
(28)
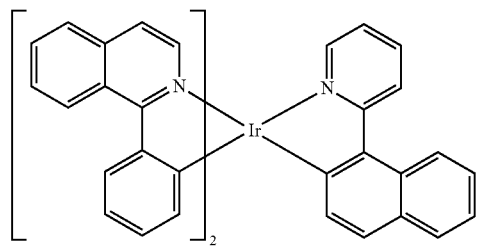
(29)
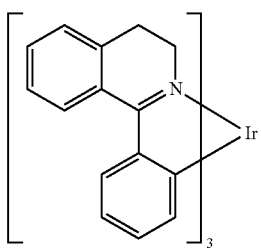
(30)
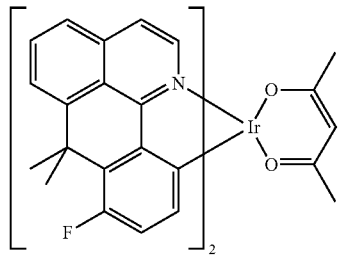

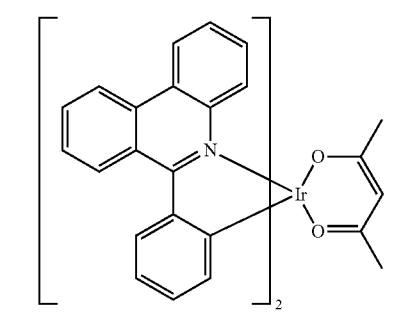
(31)
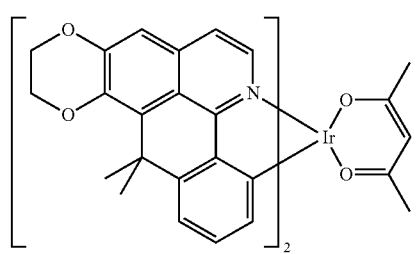
(32)
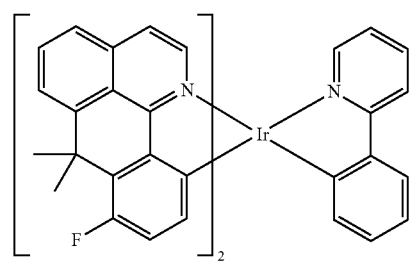
(33)
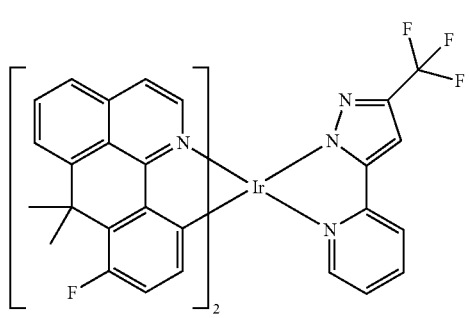
(34)
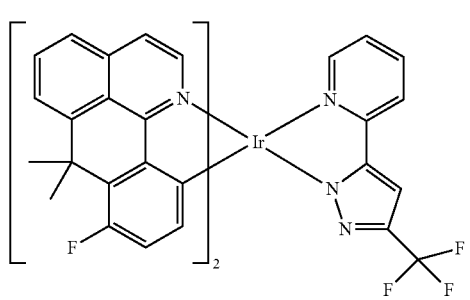
(35)
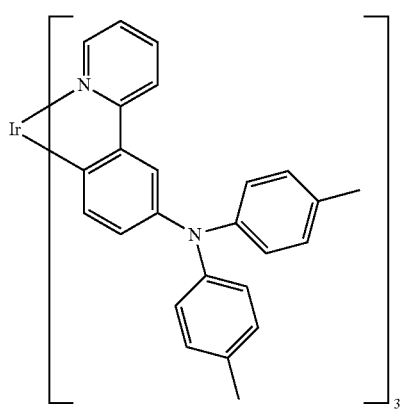
(36)
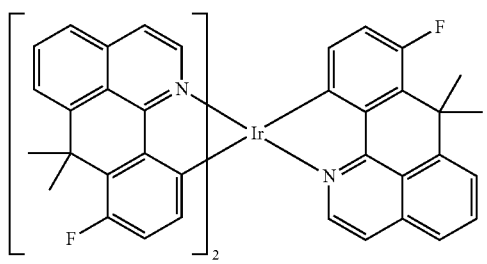
(37)
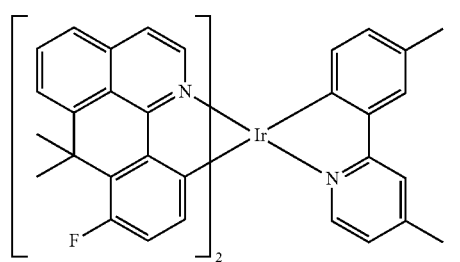
(38)
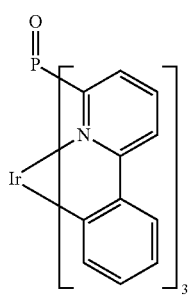
(39)
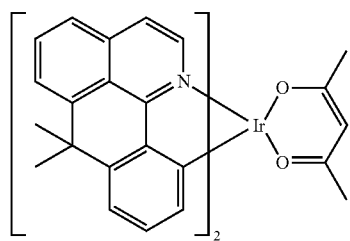
(40)

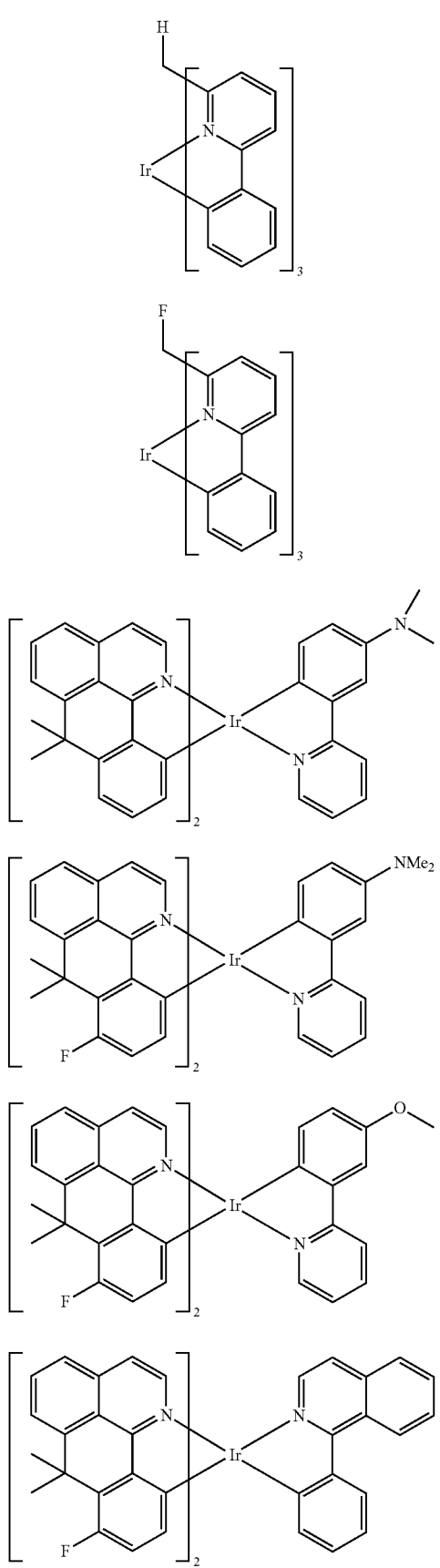
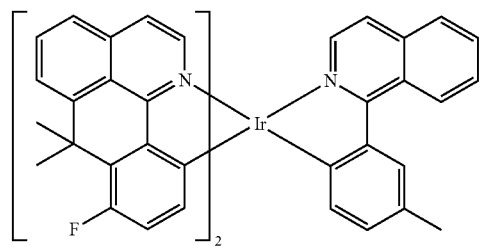
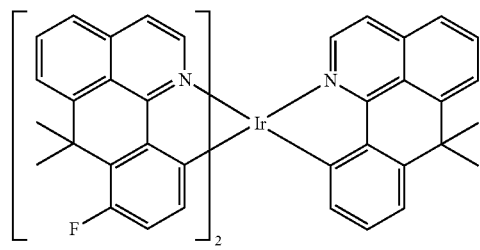
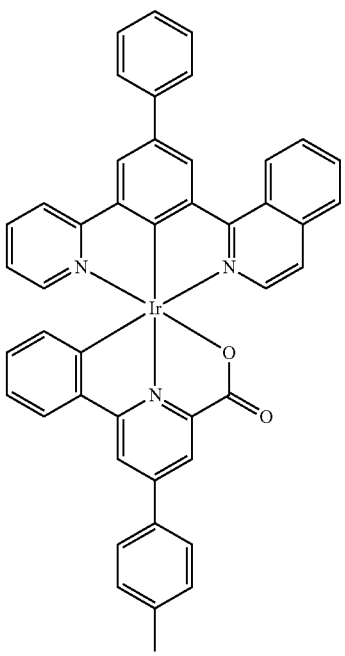

(50)
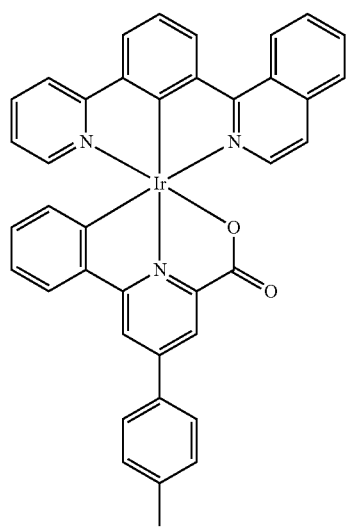
(51)
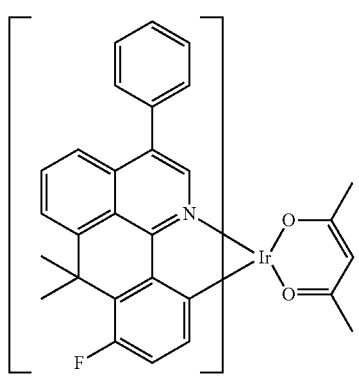
(52)
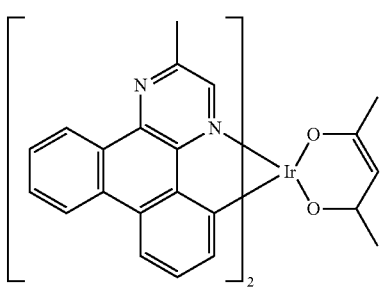
(53)
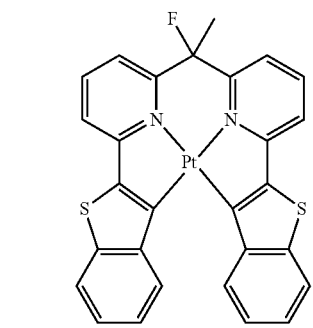
(54)
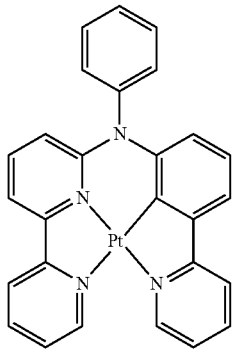
(55)
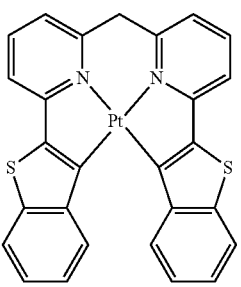
(56)
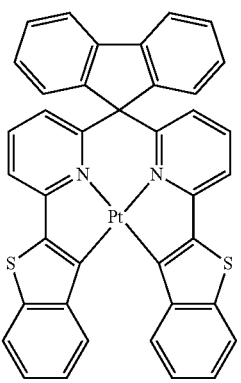
(57)
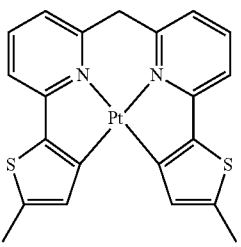
(58)
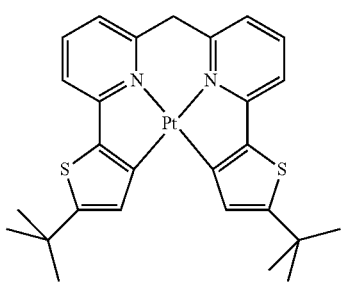

(59) 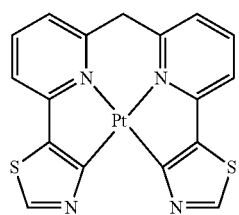
(60) 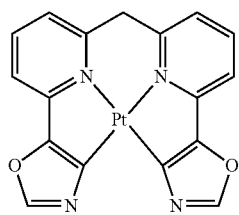
(61) 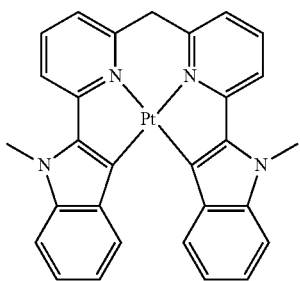
(62) 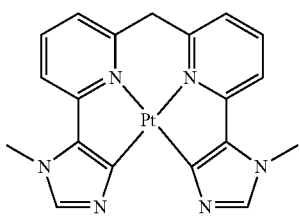
(63) 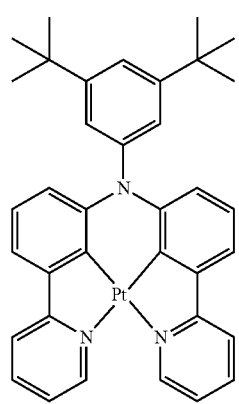
(64) 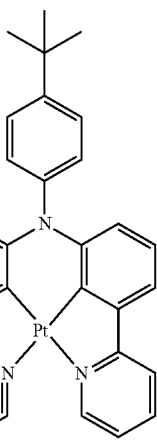
(65) 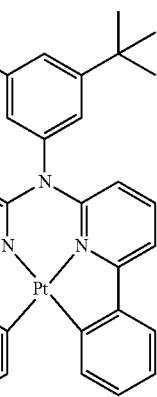
(66) 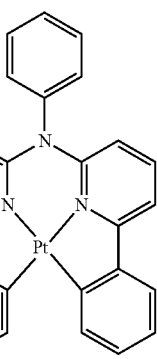
(67) 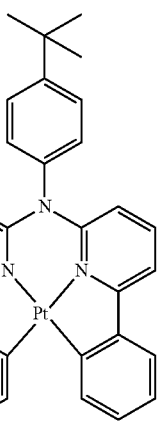

(68)
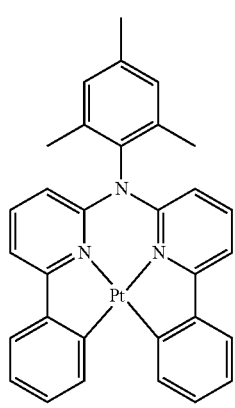
(69)
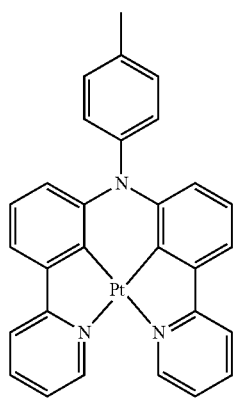
(70)
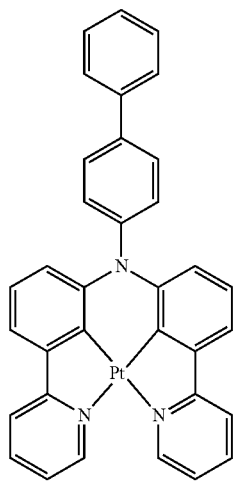
(71)
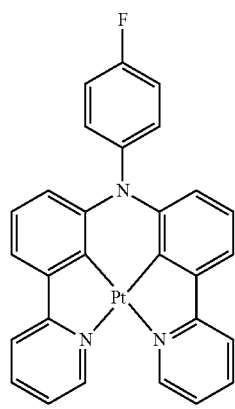
(72)
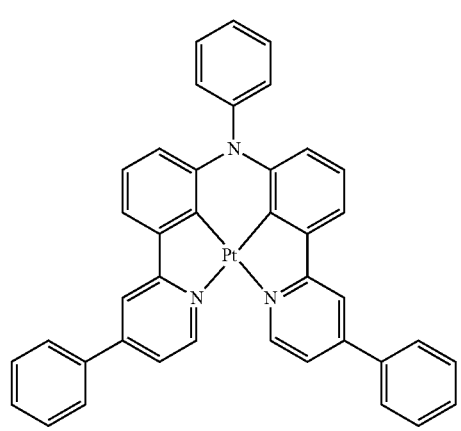
(73)
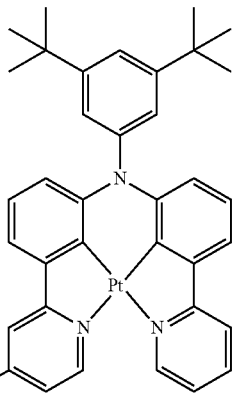

-continued
(74)
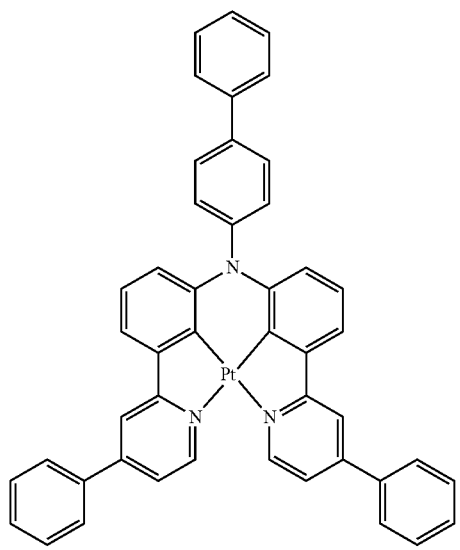
(75)
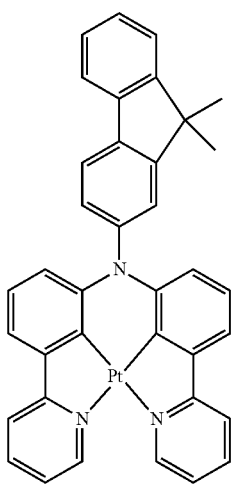
(76)
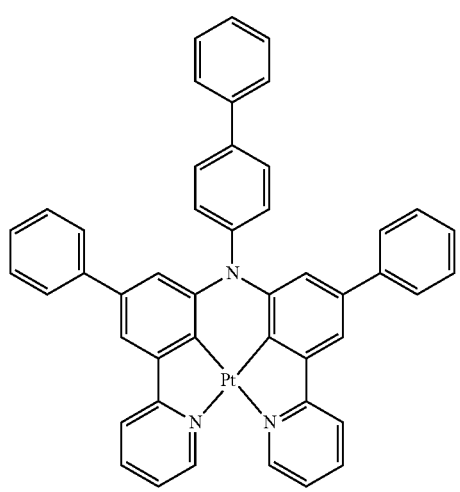
-continued
(77)
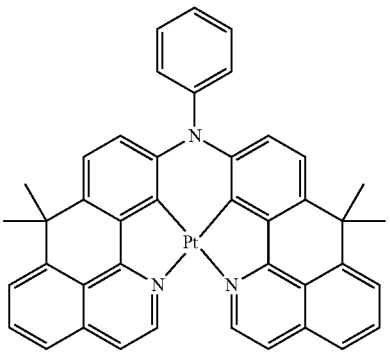
(78)
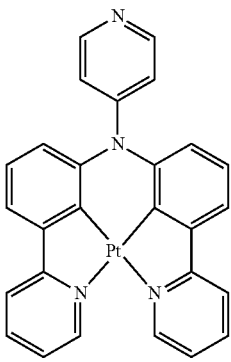
(79)
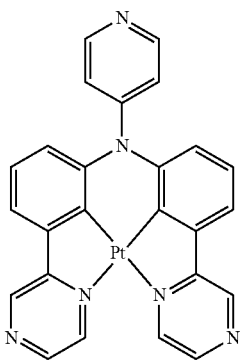
(80)

-continued
(81)
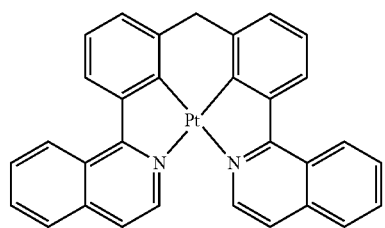
(82)
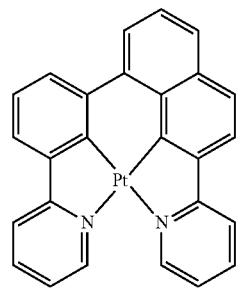
(83)
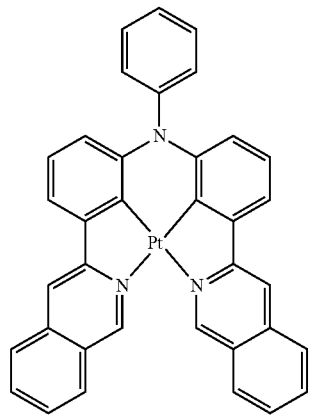
(84)
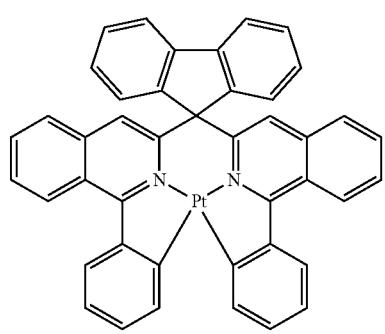
(85)
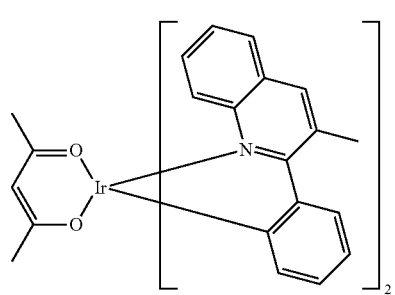
-continued
(86)
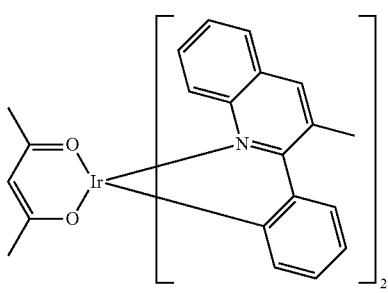
(87)
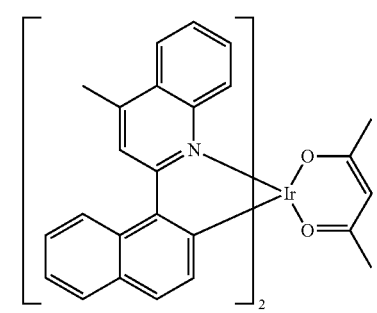
(88)
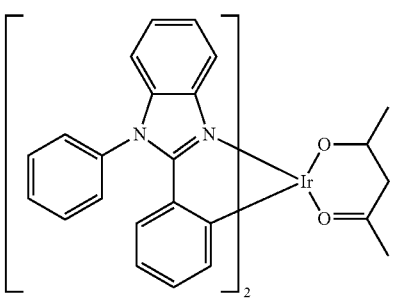
(89)
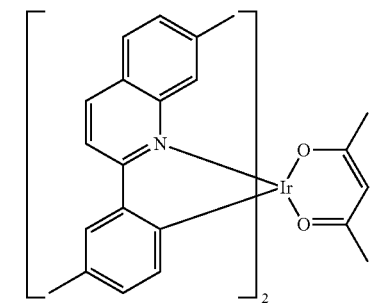
(90)
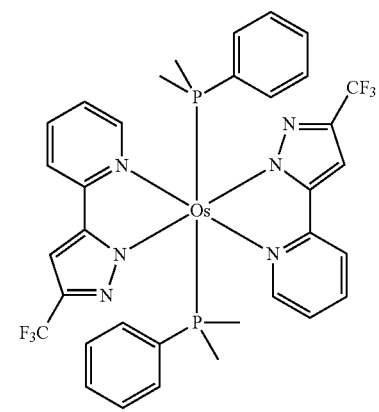

(91) 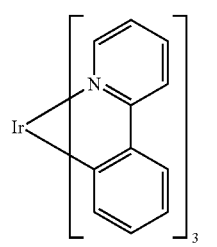
(92) 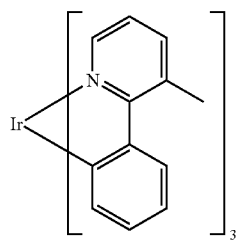
(93) 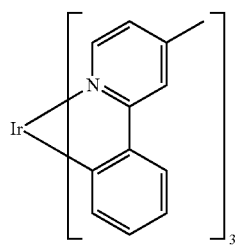
(94) 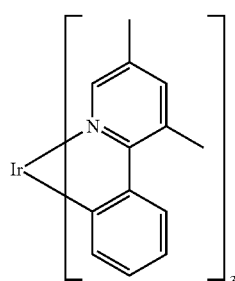
(95) 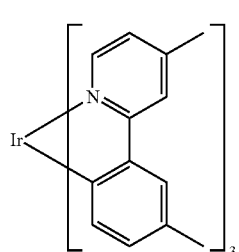
(96) 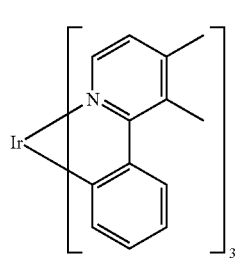
(97) 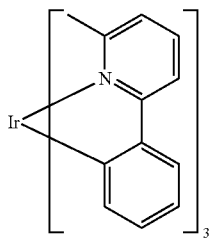
(98) 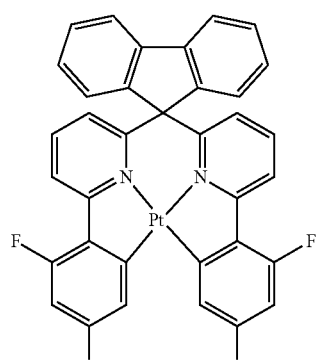
(99) 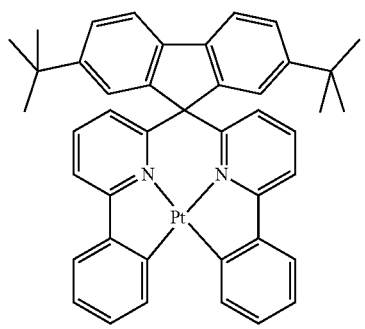
(100) 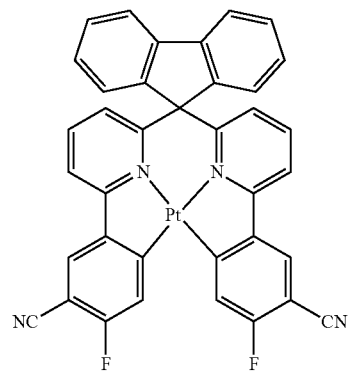
(101) 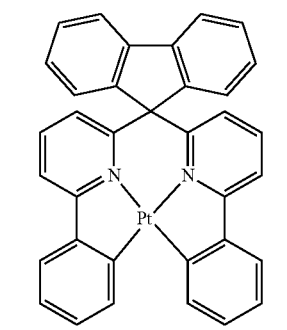

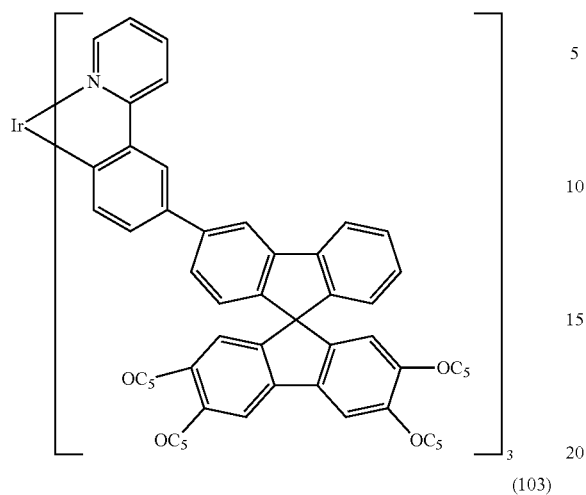
(102)
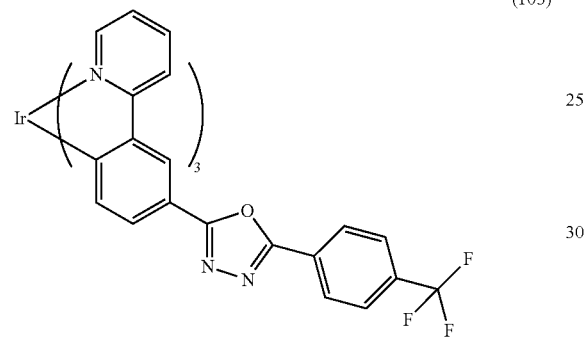
(103)
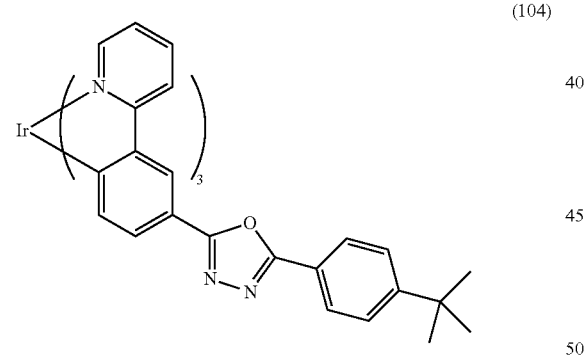
(104)
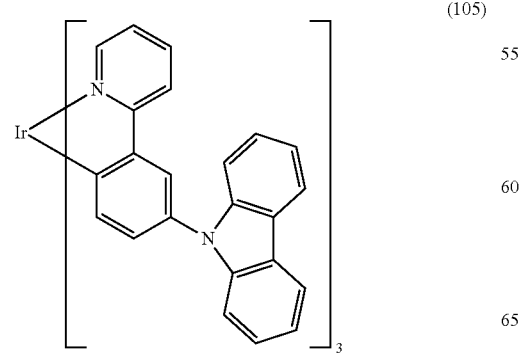
(105)
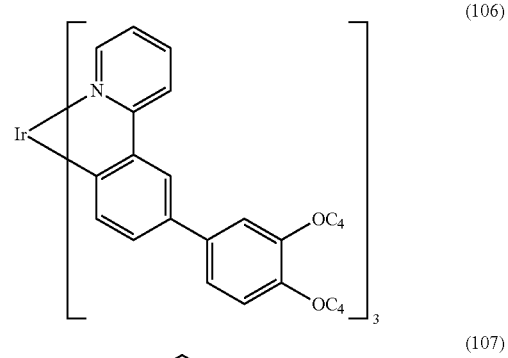
(106)
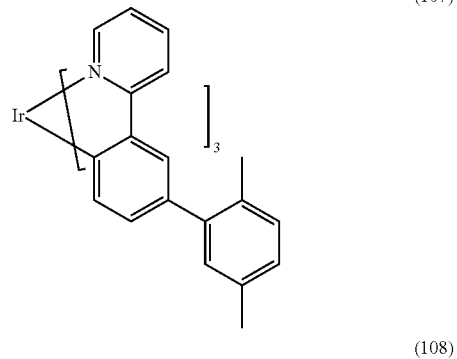
(107)
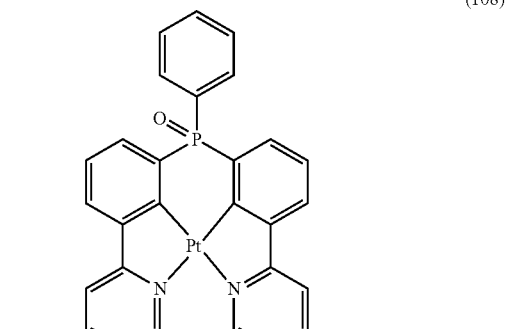
(108)
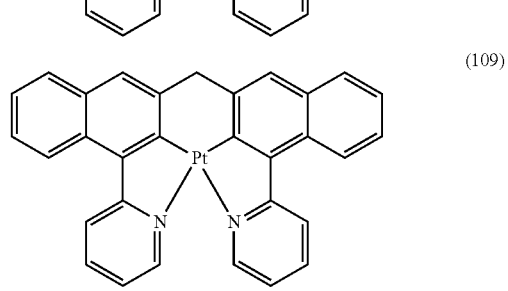
(109)
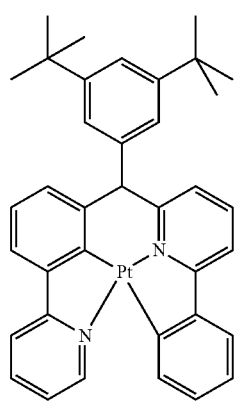
(110)

(111)
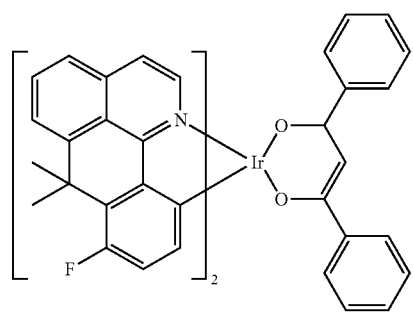
(112)
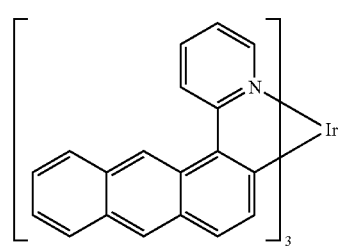
(113)
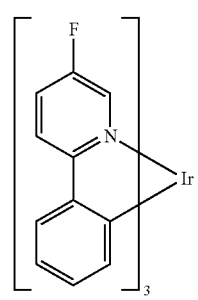
(114)
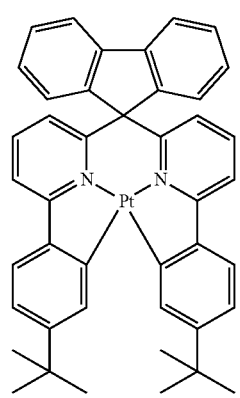
(115)
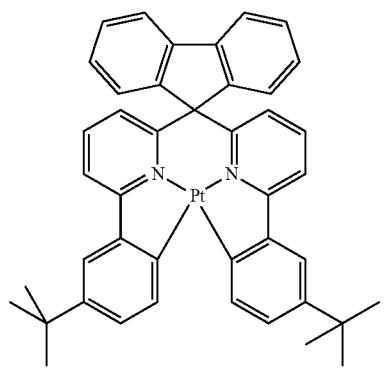
(116)
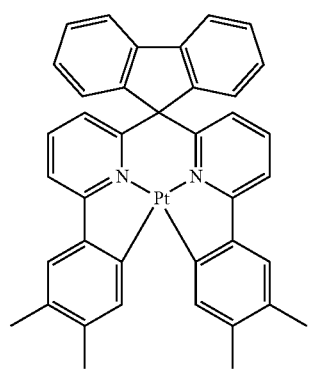
(117)
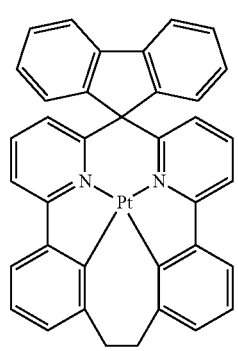
(118)
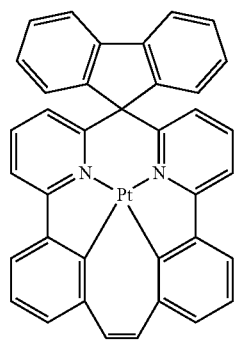
(119)
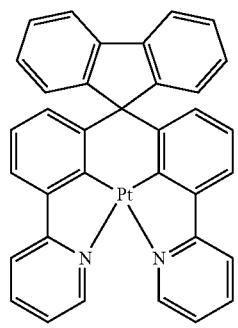

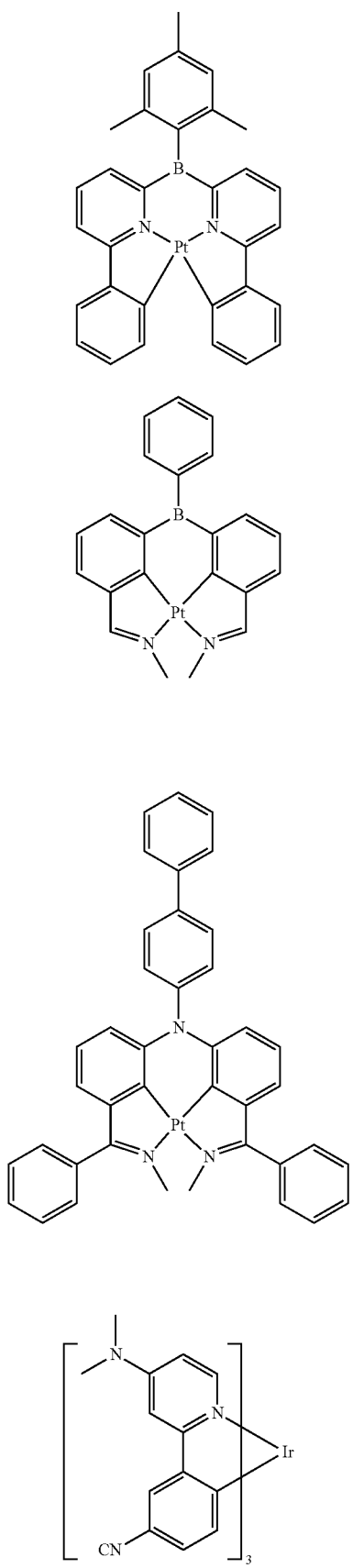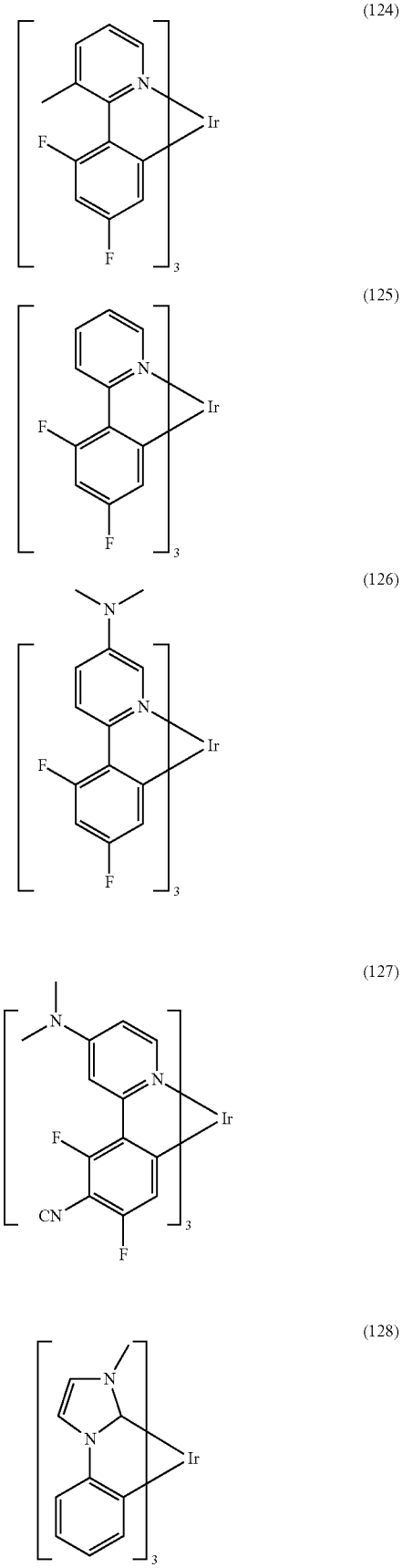

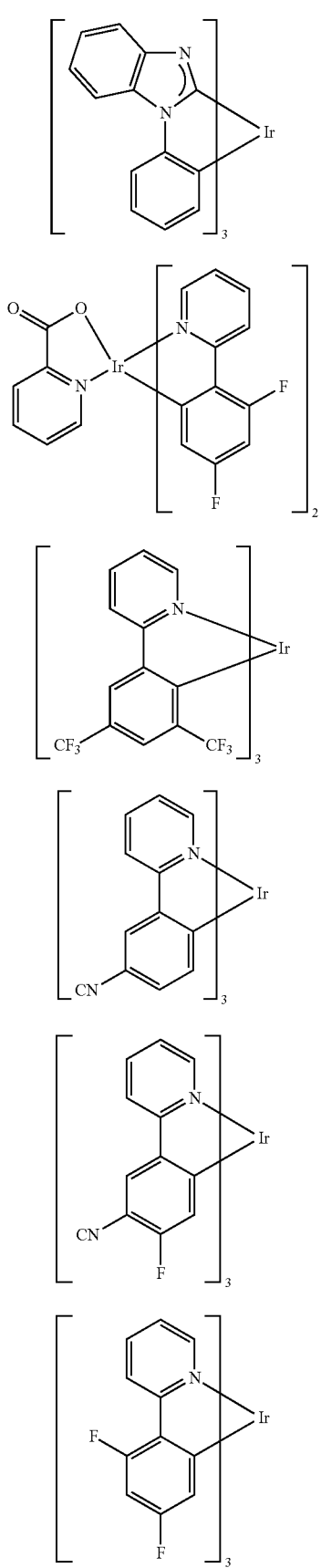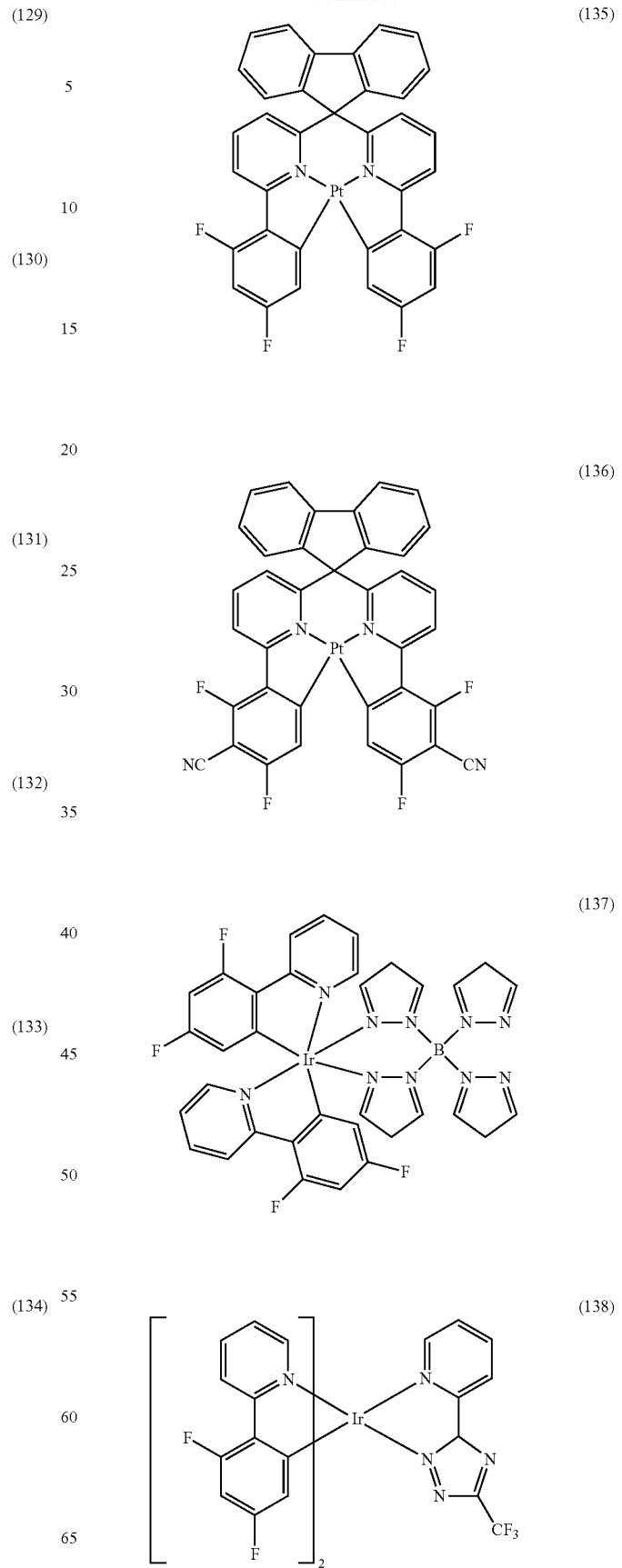

-continued

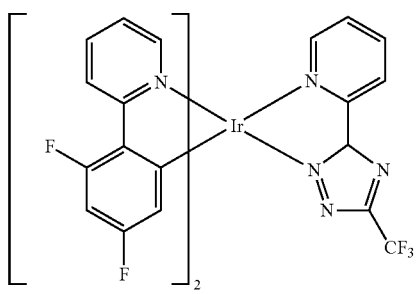

(139)

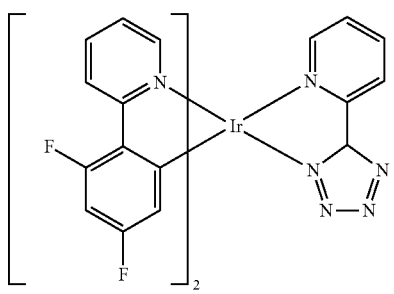

(140)

Preferred dopants are selected from the class of the monostyrylamines, the distyrylamines, the tristyrylamines, the tetrastyrylamines, the styryl-phosphines, the styryl ethers and the arylamines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. For the purposes of the present invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthraceneamines, aromatic anthracenediamines, aromatic pyreneamines, aromatic pyrenediamines, aromatic chryseneamines or aromatic chrysenediamines. An aromatic anthraceneamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyreneamines, pyrenediamines, chryseneamines and chrysenediamines are defined analogously thereto, where the diarylamino groups are preferably bonded to the pyrene in the 1-position or in the 1,6-position. Further preferred dopants are selected from indenofluoreneamines or indenofluorenediamines, for example in accordance with WO 06/122630, benzoindenofluoreneamines or benzoindenofluorenediamines, for example in accordance with WO 08/006449, and dibenzoindenofluoreneamines or dibenzoindenofluorenediamines, for example in accordance with WO 07/140847. Examples of dopants from the class of the styrylamines are substituted or unsubstituted tristilbeneamines or the dopants described in WO 06/000388, WO 06/058737, WO 06/000389, WO 07/065549 and WO 07/115610. Preference is furthermore given to the condensed hydrocarbons disclosed in DE 102008035413.

Suitable dopants are furthermore the structures depicted in the following table, and the derivatives of these structures disclosed in JP 06/001973, WO 04/047499, WO 06/098080, WO 07/065678, US 2005/0260442 and WO 04/092111.

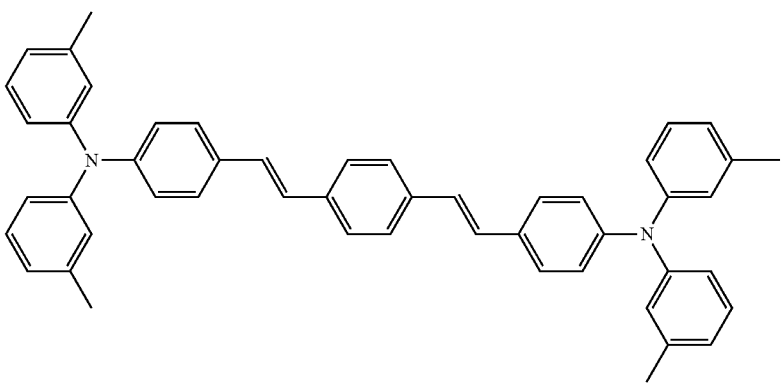

-continued

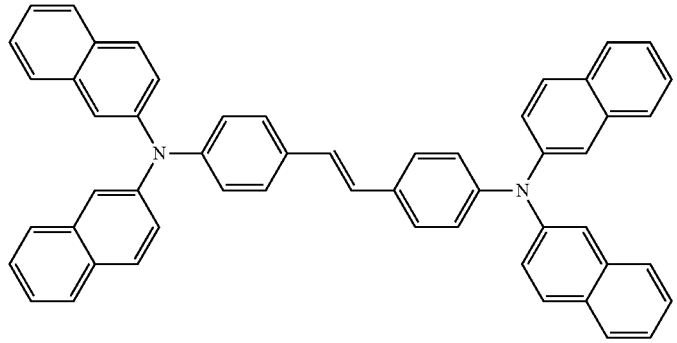

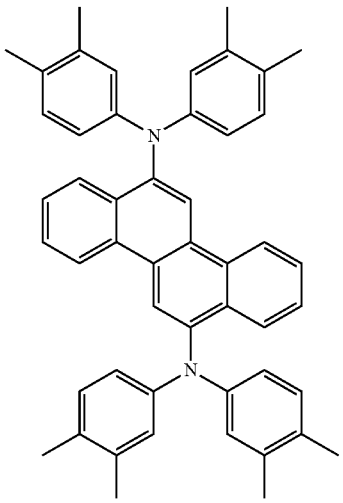

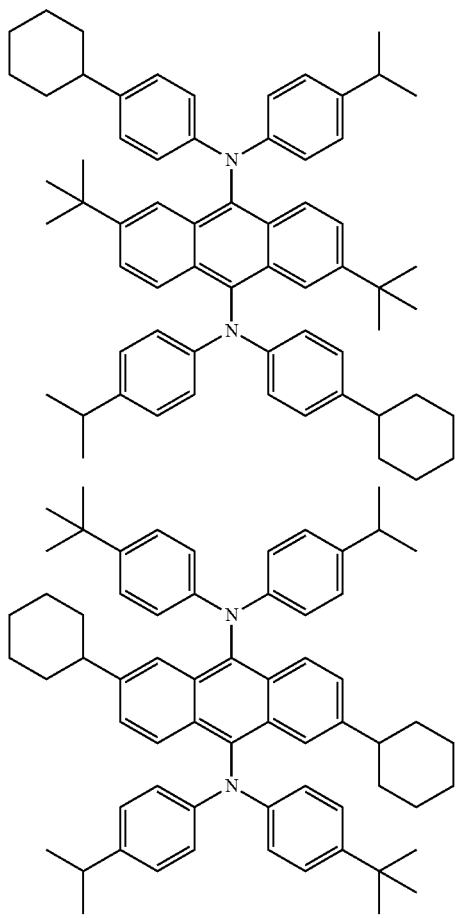

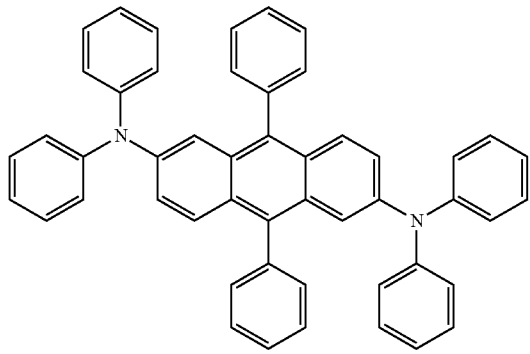

Another group of dopants are short (oligo-) arylenevinylenes (for example DPVBi or spiro-DPVBi in accordance with EP 676461).

The proportion of the dopand in the mixture of the emitting layer is between 0.1 and 50.0% by weight, preferably between 0.5 and 20.0% by weight, particularly preferably between 1.0 and 10.0% by weight. Correspondingly, the proportion of the host material is between 50.0 and 99.9% by weight, preferably between 80.0 and 99.5% by weight, particularly preferably between 90.0 and 99.0% by weight.

Suitable host materials for this purpose are materials from various classes of substance. Preferred host materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylenevinylenes, the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052), the benzanthracenes (for example in accordance with WO 08/145239), the triazines or the benzimidazoles. Suitable host materials are furthermore also the benzo[c]phenanthrene compounds according to the invention which are described above. Apart from the compounds according to the invention, particularly preferred host materials are selected from the classes of the oligoarylenes containing naphthalene, anthracene, benzanthracene and/or pyrene or atropisomers of these compounds, the oligoarylenevinylenes, the ketones, the phosphine oxides and the sulfoxides. Apart from the benzo[c]phenanthrene compounds according to the invention, very particularly preferred host materials are selected from the classes of the oligoarylenes containing anthracene, benzanthracene and/or pyrene or atropisomers of these compounds. For the purposes of this invention, an oligoarylene is intended to be taken to mean a compound in which at least three aryl or arylene groups are bonded to one another.

Suitable host materials are furthermore, for example, the materials depicted in the following table, and derivatives of these materials, as disclosed in WO 04/018587, WO 08/006449, U.S. Pat. No. 5,935,721, US 2005/0181232, JP 2000/273056, EP 681019, US 2004/0247937 and US 2005/0211958.

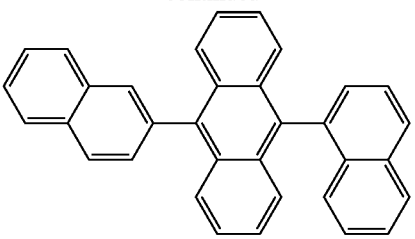

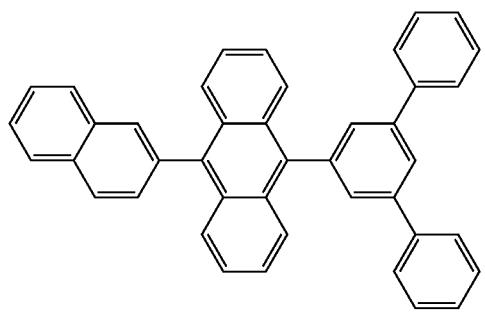

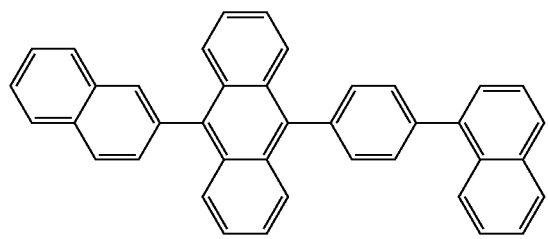

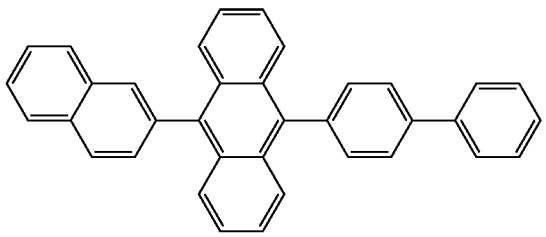

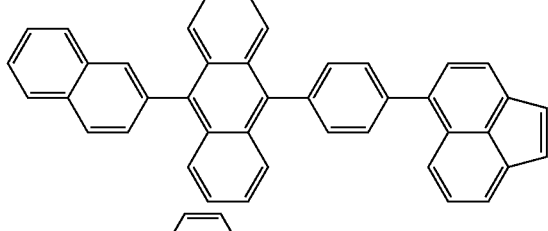

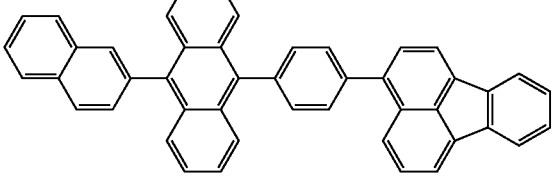

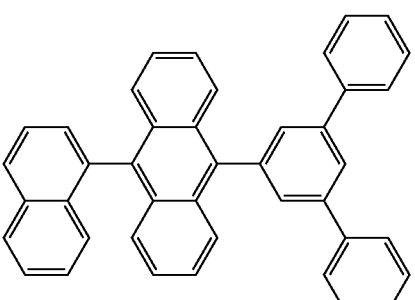

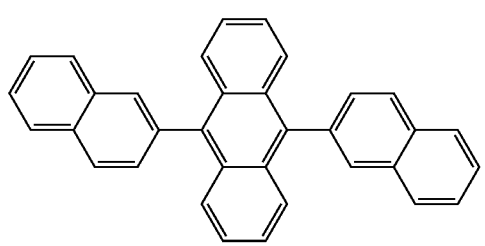

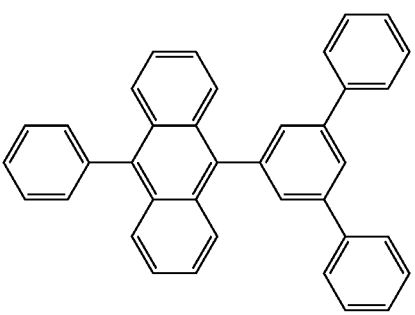

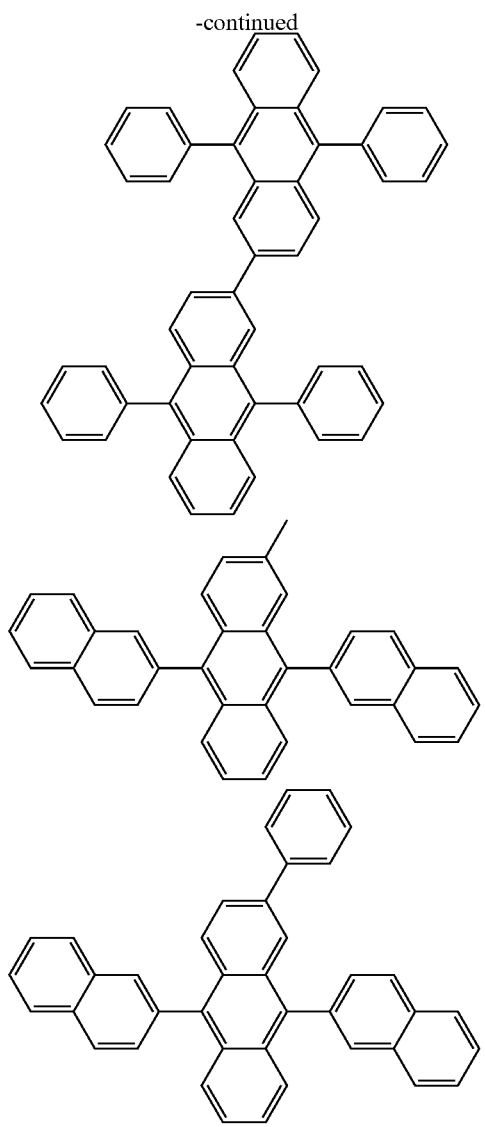

For the purposes of this invention, a hole-injection layer is a layer which is directly adjacent to the anode. For the purposes of this invention, a hole-transport layer is a layer which is located between a hole-injection layer and an emission layer. It may be preferred for them to be doped with electron-acceptor compounds, for example with $F_4$-TCNQ or with compounds as described in EP 1476881 or EP 1596445.

Apart from the materials according to the invention, suitable charge-transport materials, as can be used in the hole-injection or hole-transport layer or in the electron-injection or electron-transport layer of the organic electroluminescent device according to the invention, are, for example, the compounds disclosed in Y. Shirota et al., *Chem. Rev.* 2007, 107(4), 953-1010, or other materials as employed in these layers in accordance with the prior art.

Examples of preferred hole-transport materials which can be used in a hole-transport or hole-injection layer of the electroluminescent device according to the invention are indenofluoreneamines and derivatives (for example in accordance with WO 06/122630 or WO 06/100896), the amine derivatives as disclosed in EP 1661888, hexaazatriphenylene derivatives (for example in accordance with WO 01/049806), amine derivatives with condensed aromatics (for example in accordance with U.S. Pat. No. 5,061,569), the amine derivatives as disclosed in WO 95/09147, monobenzoindeno-fluoreneamines (for example in accordance with WO 08/006449) or dibenzoindenofluoreneamines (for example in accordance with WO 07/140847). Suitable hole-transport and hole-injection materials are furthermore derivatives of the compounds depicted above, as disclosed in JP 2001/226331, EP 676461, EP 650955, WO 01/049806, U.S. Pat. No. 4,780,536, WO 98/30071, EP 891121, EP 1661888, JP 2006/253445, EP 650955, WO 06/073054 and U.S. Pat. No. 5,061,569.

Suitable hole-transport or hole-injection materials are furthermore, for example, the materials indicated in the following table.

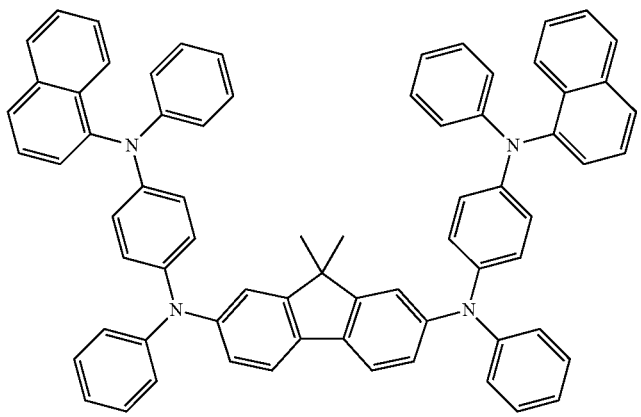

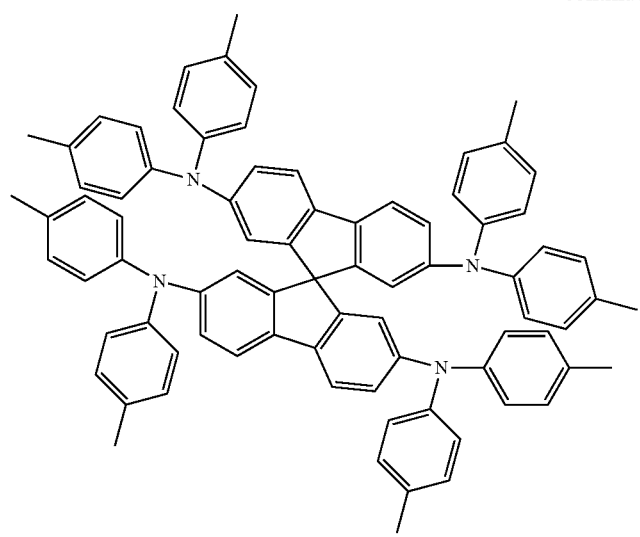
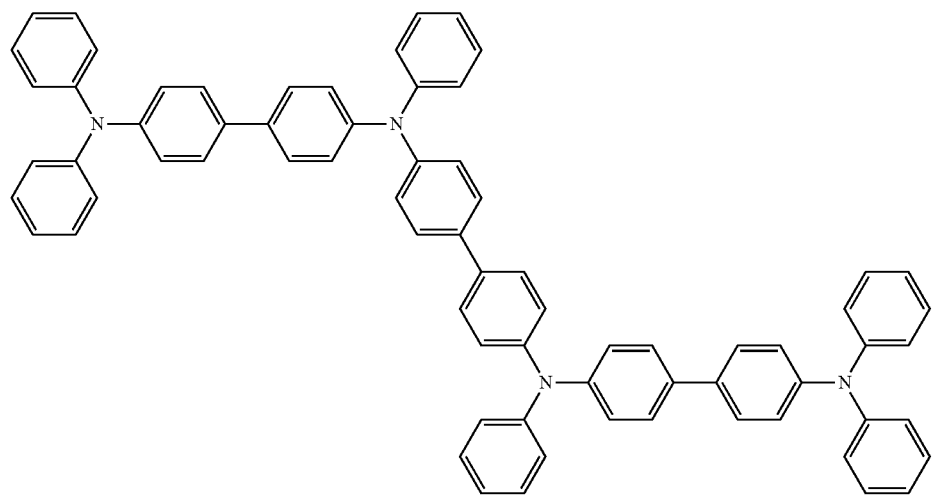
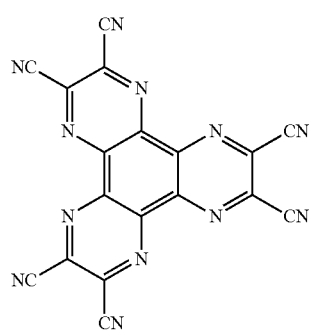
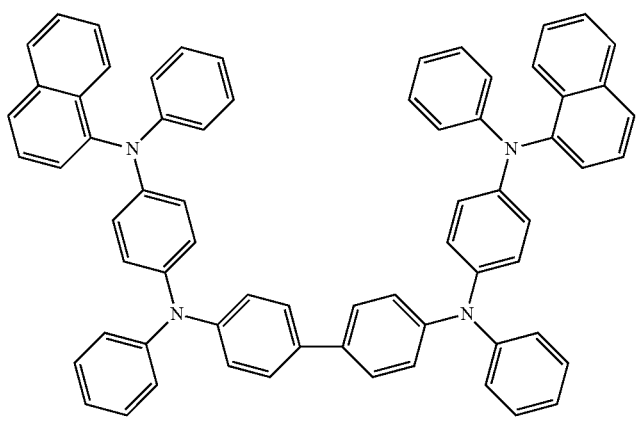

-continued
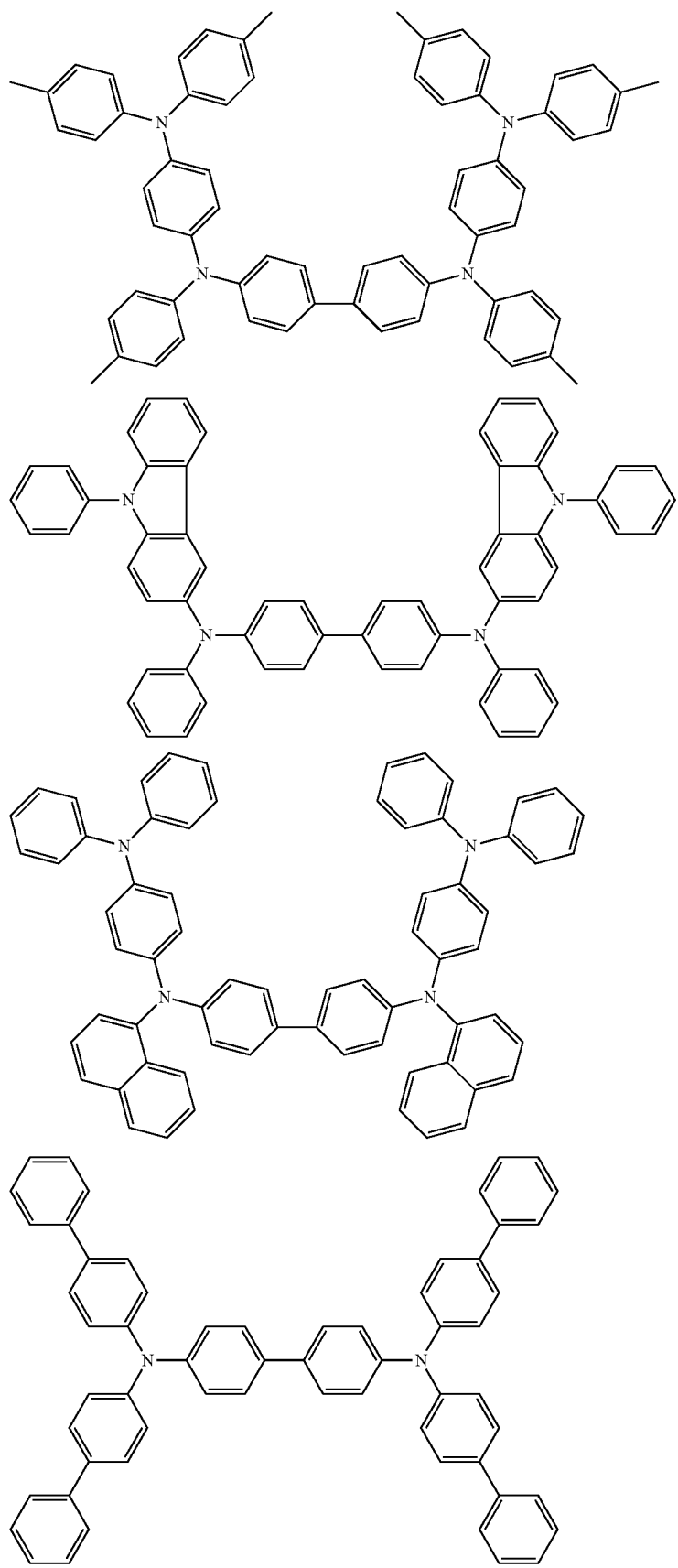

-continued
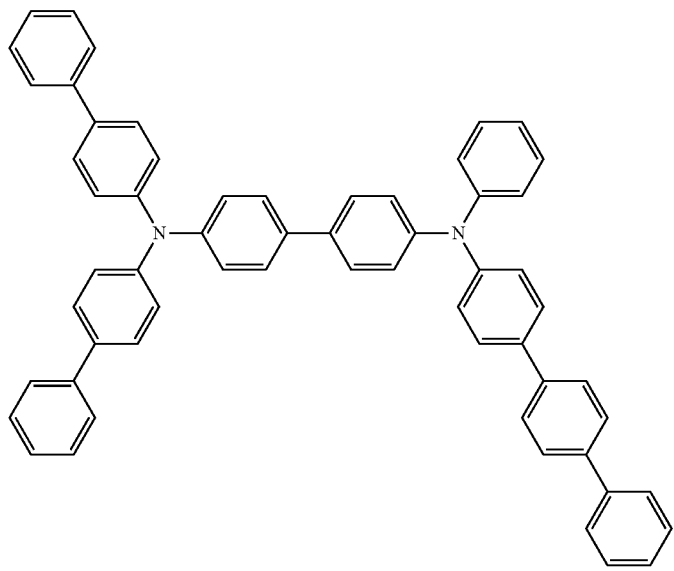
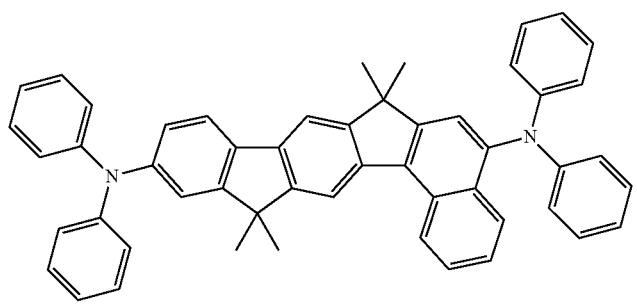
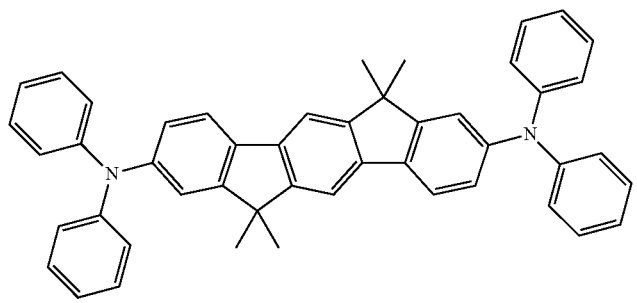
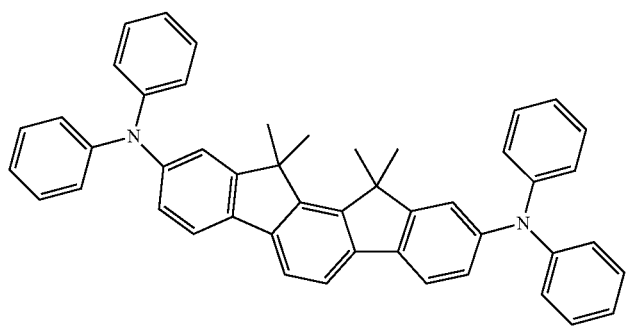

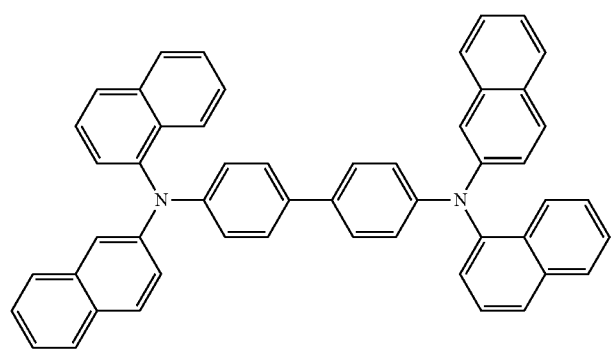
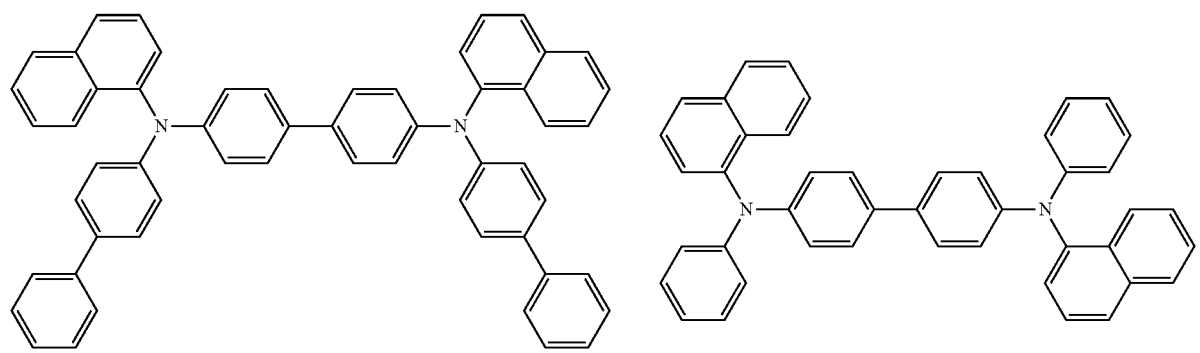
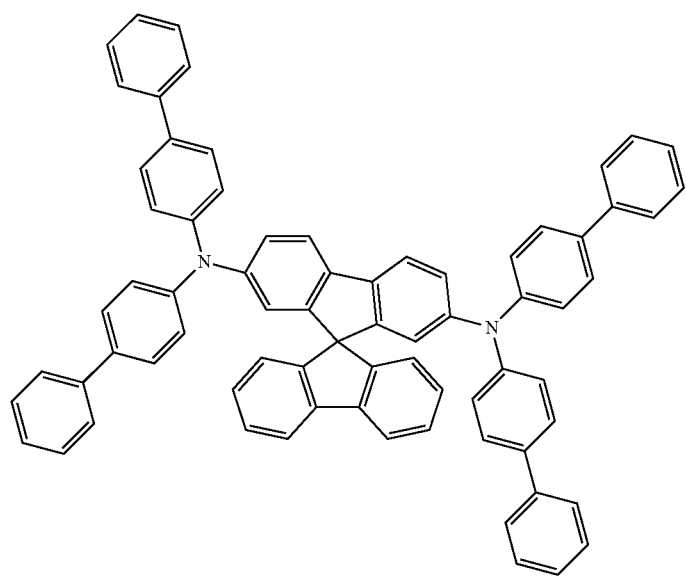

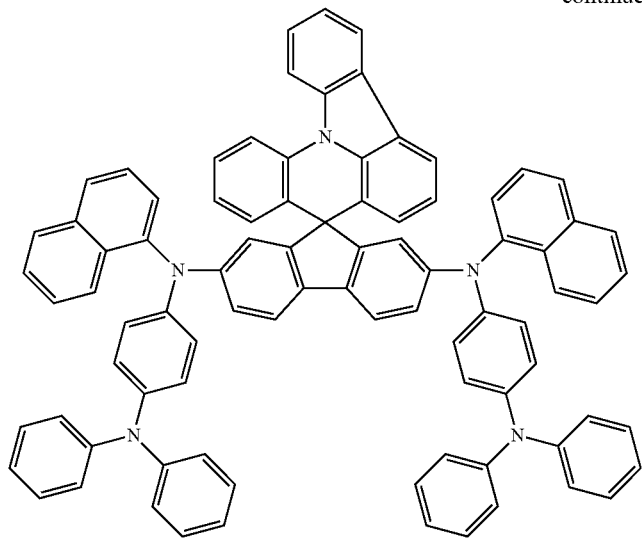

Suitable electron-transport or electron-injection materials which can be used in the electroluminescent device according to the invention are, for example, the materials indicated in the following table. Suitable electron-transport and electron-injection materials are furthermore derivatives of the compounds depicted above, as disclosed in JP 2000/053957, WO 03/060956, WO 04/028217 and WO 04/080975.

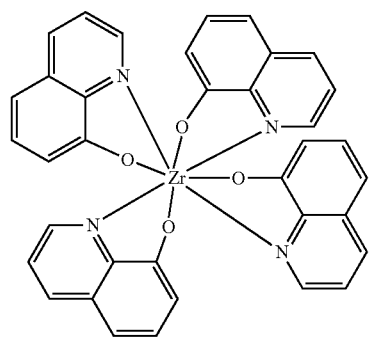

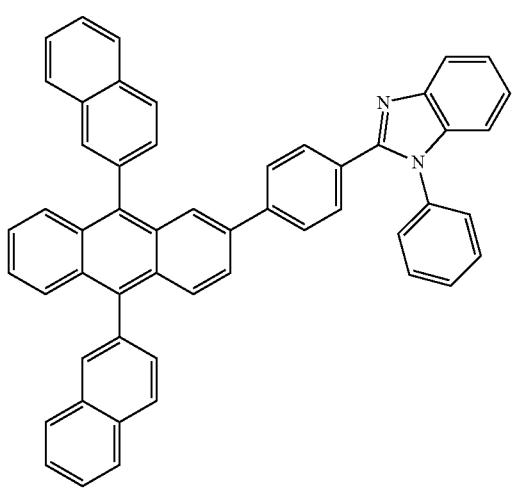

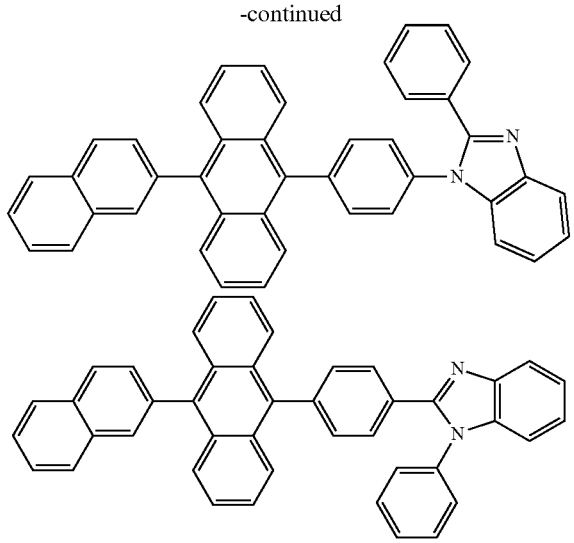

Suitable matrix materials for the compounds according to the invention are ketones, phosphine oxides, sulfoxides and sulfones, for example in accordance with WO 04/013080, WO 04/093207, WO 06/005627 or DE 102008033943, triarylamines, carbazole derivatives, for example CBP (N,N-biscarbazolylbiphenyl) or the carbazole derivatives disclosed in WO 05/039246, US 2005/0069729, JP 2004/288381, EP 1205527 or WO 08/086851, indolocarbazole derivatives, for example in accordance with WO 07/063754 or WO 08/056746, azacarbazoles, for example in accordance with EP 1617710, EP 1617711, EP 1731584, JP 2005/347160, bipolar matrix materials, for example in accordance with WO 07/137725, silanes, for example in accordance with WO 05/111172, azaboroles or boronic esters, for example in accordance with WO 06/117052, triazine derivatives, for example in accordance with DE 102008036982, WO 07/063754 or WO 08/056746, or zinc complexes, for example in accordance with DE 102007053771.

With further preferences charge transport materials can be used having a triacene structure, such as antracene and phenanthrene structures. Triacene structure means a condensed aromatic hydrocarbon structure having exactly three condensed aromatic rings. Regarding this embodiment of the present invention, triacene structures does not include tetracene or pentacene structures.

The light emitting materials and/or charge transport materials having a molecular weight of at most 5000 g/mol, preferably at most 2000 g/mol, especially at most 1500 g/mol and more preferably at most 1000 g/mol.

According to a special embodiment of the present invention, the composition can comprise 0.1 to 10% by weight, preferably 0.25 to 5% more preferably 0.5 to 4% by weight emitting materials and/or charge transport materials.

Furthermore, the composition of the present invention comprises at least one polymer. The polymer is useful as an inert binder. This means, that the polymer does not have semiconducting properties or chemically reacts with any of the semiconducting compounds in the composition. The low conducting properties of the inert polymeric binder can be determined as low permittivity. Preferred binders according to the present invention are materials of low permittivity, that is, those having a permittivity (∈) at 1,000 Hz of 3.3 or less. The organic binder preferably has a permittivity at 1,000 Hz of less than 3.0, more preferably 2.9 or less. Preferably the organic binder has a permittivity at 1,000 Hz of greater than 1.7. It is especially preferred that the permittivity of the binder is in the range from 2.0 to 2.9. The term "chemically react" as used above and below refers to a possible oxidation or other chemical reaction of the non-conductive additive with the organic light emitting materials and/or charge transport materials under the conditions used for manufacture, storage, transport and/or use of the formulation and the OLED device.

Preferably, the polymeric binder comprises a weight average molecular weight in the range of 1000 to 5,000,000 g/mol, especially 1500 to 1,000,000 g/mol and more preferable 2000 to 500,000 g/mol. Surprising effects can be achieved with polymers having a weight average molecular weight of at least 10000 g/mol, more preferably at least 100000 g/mol.

In particular, the polymer can have a polydispersity index $M_w/M_n$ in the range of 1.0 to 10.0, more preferably in the range of 1.1 to 5.0 and most preferably in the range of 1.2 to 3.

Usually, the polymeric binder is dispersible or soluble in the solvent of the present composition as described above and below. Preferably, the polymeric binder is soluble in the organic solvent and the solubility of the polymeric binder in the solvent is at least 1 g/l, especially at least 5 g/l and more preferably at least 10 g/l.

According to a special embodiment of the present invention, the composition can comprise 0.1 to 10% by weight, preferably 0.25 to 5% more preferably 0.5 to 4% by weight polymeric binder.

The weight ratio of the polymeric binder to the light emitting materials and/or charge transport materials is preferably in the range of 30:1 to 1:30, particularly in the range of 5:1 to 1:20 and more preferably in the range of 1:2 to 1:5.

According to a special embodiment the polymeric binders preferably comprise repeating units derived from styrene and/or olefins. Preferred polymeric binders can comprise at least 80%, preferably 90% and more preferably 99% by weight of repeating units derived from styrene monomers and/or olefins.

Styrene monomers are well known in the art. These monomers include styrene, substituted styrenes with an alkyl substituent in the side chain, such as α-methylstyrene and α-ethylstyrene, substituted styrenes with an alkyl substituent on the ring such as vinyltoluene and p-methylstyrene, halogenated styrenes such as monochlorostyrenes, dichlorostyrenes, tribromostyrenes and tetrabromostyrenes.

Olefins are monomers consisting of hydrogen and carbon atoms. These monomers include ethylene, propylene, butylenes, isoprene and 1,3-butadiene.

According to a special aspect of the present invention, the polymeric binder is polystyrene having a weight average molecular weight in the range of 50,000 to 2,000,000 g/mol, preferably 100,000 to 750,000 g/mol, more preferably in the range of 150,000 to 600,000 g/mol and most preferably in the range of 200,000 to 500,000 g/mol.

According to a further embodiment of the present invention, the polymeric binder is poly-4-methylstyrene having a weight average molecular weight in the range of 40,000 to 120,000 g/mol, more preferably in the range of 60,000 to 100,000 g/mol.

Especially, the binder can be poly-α-methyl styrene having a weight average molecular weight in the range of 1,000 to 20,000 g/mol, more preferably in the range of 1,500 to 6,000 g/mol.

Useful and preferred polymeric binders comprise Hansen Solubility parameters of $H_d$ in the range of 15.7 to 23.0 $MPa^{0.5}$, $H_p$ in the range of 0.0 to 20.0 $MPa^{0.5}$ and $H_h$ in the range of 0.0 to 12.5 $MPa^{0.5}$. More preferred polymeric binders comprise Hansen Solubility parameters of $H_d$ in the range of 17.0 to 21.0 $MPa^{0.5}$, $H_p$ in the range of 1.0 to 5.0 $MPa^{0.5}$ and $H_h$ in the range of 2.0 to 10.0 $MPa^{0.5}$. Most preferred polymeric binders comprise Hansen Solubility parameters of $H_d$ in the range of 19.0 to 21.0 $MPa^{0.5}$, $H_p$ in the range of 1.0 to 3.0 $MPa^{0.5}$ and $H_h$ in the range of 2.5 to 5.0 $MPa^{0.5}$.

The Hansen Solubility Parameters can be determined according to the Hansen Solubility Parameters in Practice (HSPiP) program ($2^{nd}$ edition) as supplied by Hanson and Abbot et al.

Examples of useful polymeric binders are disclosed in Table 1.

TABLE 1

Hansen Solubility Parameters of useful polymeric binders

| Polymer | $H_d$ [$MPa^{0.5}$] | $H_h$ [$MPa^{0.5}$] | $H_p$ [$MPa^{0.5}$] | Tg |
|---|---|---|---|---|
| 1,4-Polyisoprene | 16.8 | 2.9 | 5.2 | |
| Polynorbornene | 19.7 | 0 | 0.0* | |
| Poly(styrene-block-butadiene); 31% wt styrene | 17.7 | 2.3 | 5.4 | |
| Poly(styrene-block-butadiene-block-styrene); 30% wt styrene | 17.7 | 2.3 | 5.5 | |
| Poly(styrene-co-maleic anhydride) (and ethylene/butylene) 1-1.7% maleic anhydride | 17.3 | 5.1 | 5.4 | |
| Poly(styrene-block-ethylene/butylene-block-styrene) triblock polymer 13% styrene | 16.4 | 5.2 | 3.5 | |
| Poly(styrene-block-ethylene-propylene-block-styrene) triblock polymer; 37% wt styrene | 17.5 | 4.6 | 5.2 | |
| Poly(styrene-block-ethylene/butylene-block-styrene) triblock polymer; 29% wt styrene | 17 | 4.5 | 3.5 | |
| Poly(1-vinylnaphthalene) | 22.8 | 19.7 | 8.3 | 162 |
| Poly(1-vinylpyrrolidone-co-styrene); 64% styrene | 19.7 | 4.4 | 5.6 | |
| Poly(1-vinylpyrrolidone-co-vinyl acetate) 1.3:1 | 18.8 | 9.2 | 10.4 | 64 |
| Poly(2-chlorostyrene) | 19.8 | 15.8 | 2.1 | 103 |

TABLE 1-continued

Hansen Solubility Parameters of useful polymeric binders

| Polymer | $H_d$ [MPa$^{0.5}$] | $H_h$ [MPa$^{0.5}$] | $H_p$ [MPa$^{0.5}$] | Tg |
|---|---|---|---|---|
| Poly(2-vinylnaphthalene) | 22.8 | 19.7 | 8.3 | 135 |
| Poly(2-vinylpyridine-co-styrene); 1:1 | 19.5 | 0.9 | 5.9 | 96 |
| Poly(4,5-Difluoro-2,2-bis(CF3)-1,3-dioxole-co-tetrafluoroethylene) Teflon | 16.2 | 5.8 | 3.7 | 160 |
| Poly(4-chlorostyrene) | 19.8 | 7.1 | 3 | 106 |
| Poly(4-methyl-1-pentene) | 16.3 | 7.7 | 4.9 | |
| Poly(4-methylstyrene) | 19.3 | 3.1 | 3.6 | 106 |
| Poly(4-vinylpyridine-co-styrene) 1:1 | 19.5 | 0.9 | 5.9 | |
| Poly(alpha-methylstyrene) | 18.5 | 7.2 | 3.8 | |
| Poly(butadiene-graft-poly(methyl acrylate-co-acrylonitrile)) 1:1:1 | 17.2 | 5.4 | 8 | |
| Poly(butyl methacrylate-co-isobutyl methacrylate) 1:1 | 16.8 | 3.6 | 9.7 | 35 |
| Poly(butyl methacrylate-co-methyl methacrylate) 1:1 | 16.5 | 7 | 10.3 | 52 |
| Poly(cyclohexylmethacrylate) | 17.1 | 4.5 | 7.9 | |
| Poly(ethylene-co-1-butene-co-1-hexene) 1:1:1 | 16.2 | 6 | 3.6 | 95 |
| Poly(ethylene-co-ethylacrylate-co-maleic anhydride); 2% anhydride, 32% ethyl acrylate | 16.4 | 8.7 | 6.7 | 65 |
| Poly(ethylene-co-glycidyl methacrylate) 8% glycidyl methacrylate | 16.2 | 7.3 | 6.1 | 87 |
| Poly(ethylene-co-methyl acrylate-co-glycidyl methacrylate); 8% glycidyl methacrylate; 25% methyl acrylate | 16.5 | 7.7 | 7.2 | |
| Poly(ethylene-co-octene) 1:1 | 16.4 | 5.8 | 3.9 | |
| Poly(ethylene-co-propylene-co-5-methylene-2-norbornene); 50% ethylene | 18.1 | 4.4 | 6.7 | |
| Poly(ethylene-co-tetrafluoro-ethylene) 1:1 | 16.9 | 3.9 | 3.3 | |
| Poly(isobutyl methacrylate) | 16.9 | 2.8 | 11.2 | |
| Poly(isobutylene) | 15.8 | 3.7 | 1.3 | |
| Poly(methyl methacrylate)-co-(fluorescein O-methacrylate) 80% methyl methacrylate | 17.2 | 10.5 | 11.3 | 148 |
| Poly(methyl methacrylate-co-butyl methacrylate) 85% methyl methacrylate | 16.3 | 8.9 | 11.8 | 105 |
| Poly(methyl methacrylate-co-ethyl acrylate) 5% ethyl acrylate | 16.2 | 9.7 | 12.2 | |
| Poly(propylene-co-butene) 12% 1-butene | 16.4 | 4.5 | 6 | 138 |
| Poly(styrene-co-allyl alcohol) 40% allyl alcohol | 18.9 | 1.2 | 12.1 | 63 |
| Poly(styrene-co-maleic anhydride) 7% maleic anhydride | 19.8 | 3 | 3.8 | 120 |
| Poly(styrene-co-maleic anhydride) cumene terminated (1.3:1) | 20 | 9.5 | 5.6 | 154 |
| Poly(styrene-co-methyl methacrylate); 40% styrene | 17.6 | 6.5 | 8.8 | 101 |
| Poly(vinyltoluene-co-alpha-methylstyrene) 1:1 | 18.9 | 5.2 | 3.7 | 52 |
| Poly-2-vinylpyridine | 19.3 | 0 | 8.2 | |
| Poly-4-vinylpyridine | 19.3 | 0 | 8.2 | 137 |
| Poly-alpha-pinene | 17 | 1.5 | 4.5 | 25 |
| Polybenzylmethacrylate | 18.2 | 5.7 | 8.4 | 54 |
| Polyethyl methacrylate | 16 | 7.7 | 10.3 | |
| Polyethylene | 16.1 | 7.7 | 5.7 | |
| Polyethylene terephthalate | 19.3 | 1.2 | 0.0 | 115 |
| Polyethylene-co-ethylacrylate; 18% ethyl acrylate | 16.2 | 8.1 | 6.2 | 116 |
| Polyethylene-co-vinylacetate 12% vinyl acetate | 16.3 | 7.9 | 6.4 | 61 |
| Polyethylene-graft-maleic anhydride 0.5% maleic anhydride | 16.1 | 7.8 | 5.7 | |
| Polymethyl methacrylate | 16.2 | 4.6 | 9.3 | |
| Polypropylene | 16.4 | 4.8 | 6.6 | 105 |
| Polypropylene-graft-maleic anhydride 8-10% maleic anhydride | 16.8 | 6.2 | 6.8 | 157 |
| Polystyrene | 19.7 | 1.7 | 3.5 | |
| Poly(styrene-block-ethylene/butylene-block-styrene) graft maleic anhydride; 2% maleic anhydride; 1:1:1 others | 17.6 | 4.3 | 5.2 | |
| Poly(styrene-block-butadiene) branched; 1:1 | 18.3 | 2.1 | 4.9 | |
| Poly(styrene-block-butadiene-block-styrene) 30% styrene | 17.7 | 2.3 | 5.5 | |
| Poly(styrene-block-isoprene) 10% wt styrene | 17.1 | 2.8 | 5 | |
| Poly(styrene-block-isoprene-block-styrene) 17% wt styrene | 17.3 | 2.7 | 4.9 | |
| Poly(styrene-co-4-chloromethylstyrene-co-4-methoxymethylstyrene 2:1:1 | 19.6 | 5.5 | 4.5 | |
| Polystyrene-co-acrylonitrile 25% acrylonitrile | 19.2 | 2.5 | 4.5 | |
| Polystyrene-co-alpha-methylstyrene 1:1 | 19.1 | 4.5 | 3.7 | 67 |
| Polystyrene-co-butadiene 4% butadiene | 19.6 | 1.7 | 3.6 | |
| Polystyrene-co-butadiene 45% styrene | 18.1 | 2.1 | 5 | |
| Polystyrene-co-chloromethylstyrene 1:1 | 19.9 | 8.6 | 3.2 | |
| Polyvinylchloride | 18.2 | 15.1 | 4.7 | |
| Polyvinylcinnamate | 19.9 | 3.3 | 7.8 | |
| Polyvinylcyclohexane | 17.6 | 3.1 | 1.9 | |
| Polyvinylidenefluoride | 17.3 | 1.9 | 2.8 | |
| Polyvinylidenefluoride-co-hexafluoropropylene assume 1:1 | 16.4 | 2 | 1.7 | |
| Poly(styrene-block-ethylene/propylene-block-styrene); 30% styrene | 17.4 | 2.8 | 4.2 | |
| Poly(styrene-block-ethylene/propylene-block-styrene); 18% styrene | 17 | 3 | 4.3 | |
| Poly(styrene-co-ethylene/propylene-block-styrene); 13% styrene | 16.8 | 3.1 | 4.4 | |
| Poly(styrene-block ethylene block-ethylene/propylene-block styrene); 32% styrene | 17.5 | 3 | 3.5 | |
| Poly(styrene-block ethylene block-ethylene/propylene-block styrene); 30% styrene | 17.4 | 3 | 3.5 | |
| Poly(styrene-block-ethylene-butylene-block-styrene); 31% styrene | 17.5 | 3.1 | 2.9 | |
| Poly(styrene-block-ethylene/butylene-block-styrene); 34% styrene | 17.6 | 3.1 | 2.9 | |

TABLE 1-continued

Hansen Solubility Parameters of useful polymeric binders

| Polymer | $H_d$ [MPa$^{0.5}$] | $H_h$ [MPa$^{0.5}$] | $H_p$ [MPa$^{0.5}$] | Tg |
|---|---|---|---|---|
| Poly(styrene-block-ethylene/butylene-block-styrene); 30% styrene | 17.5 | 3.2 | 2.9 | |
| Poly(styrene-block-ethylene/butylene-block-styrene); 60% styrene | 18.4 | 2.5 | 3.1 | |

$H_d$ refers to Dispersion contribution
$H_p$ refers to Polar contribution
$H_h$ refers to Hydrogen bonding contribution According to a preferred embodiment of the present invention, the inert binder is a polymer having a glass transition temperature in the range of −70 to 160° C., preferably 0 to 150° C., more preferably 50 to 140° C. and most preferably 70 to 130° C. The glass transition temperature can be determined by measuring the DSC of the polymer (DIN EN ISO 11357, heating rate 10° C., per minute).

The composition of the present invention comprises at least one solvent, preferably at least one aromatic solvent. The solvents are preferably selected from the group consisting of aromatic hydrocarbons, like toluene, o-, m- or p-xylene, trimethyl benzenes (e.g. 1,2,3-, 1,2,4- and 1,3,5-trimethyl benzenes), tetralin, other mono-, di-, tri- and tetraalkylbenzenes (e.g. diethylbenzenes, methylcumene, tetramethylbenzenes etc), aromatic ethers (e.g. anisole, alkyl anisoles, e.g. 2, 3 and 4 isomers of methylanisole, 2,3-, 2,4-, 2,5-, 2,6-, 3,4- and 3,5-isomers of dimethylanisole), naphthalene derivatives, alkylnaphthalene derivatives (e.g. 1- and 2-methylnaphthalene), di- and tetrahydronaphthalene derivatives. Also preferred are aromatic esters (e.g alkyl benzoates), aromatic ketones (e.g. acetophenone, propiophenone), alkyl ketones (e.g. cyclohexanone), heteroaromatic solvents (e.g. thiophene, mono-, di- and trialkyl thiophenes, 2-alkylthiazoles, benzthiazoles etc, pyridines), halogenarylenes and anilin derivatives. These solvents may comprise halogen atoms.

Especially preferred are: 3-fluoro-trifluoromethylbenzene, trifluoromethylbenzene, dioxane, trifluoromethoxybenzene, 4-fluoro-benzenetrifluoride, 3-fluoropyridine, toluene, 2-fluorotoluene, 2-fluoro-benzenetrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluorobenzene, p-xylene, m-xylene, o-xylene, 2,6-lutidine, 2-fluoro-m-xylene, 3-fluoro-o-xylene, 2-chlorobenzenetrifluoride, dimethylformamide, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, 2-methylanisole, phenetol, benzenedioxol, 4-methylanisole, 3-methylanisole, 4-fluoro-3-methylanisole, 1,2-dichloro-benzene, 2-fluorobenzenenitril, 4-fluoroveratrol, 2,6-dimethylanisole, aniline, 3-fluorobenzenenitril, 2,5-dimethylanisole, 3,4-dimethylanisole, 2,4-dimethylanisole, benzenenitril, 3,5-dimethylanisole, N,N-dimethylaniline, 1-fluoro-3,5-dimethoxybenzene, phenylacetate, N-methylaniline, methylbenzoate, N-methylpyrrolidone, morpholine, 1,2-dihydronaphthalene, 1,2,3,4-tetrahydronaphthalene, o-tolunitril, veratrol, ethylbenzoate, N,N-diethylaniline, propylbenzoate, 1-methylnaph-thalene, butylbenzoate, 2-methylbiphenyl, 2-phenylpyridin or 2,2'-Bitolyl.

More preferred are aromatic hydrocarbons especially toluene, dimethylbenzenes (xylenes), trimethyl benzenes, tetralin and methylnaphthalenes, aromatic ethers, especially anisole and aromatic esters, especially methyl benzoate.

Most preferred are aromatic ethers, especially anisole and derivates thereof, such as alkyl anisoles, and aromatic esters, especially methylbenzoate.

These solvents can be used as mixture of two, three or more.

Preferred organic solvents can comprise Hansen Solubility parameters of $H_d$ in the range of 17.0 to 23.2 MPa$^{0.5}$, $H_p$ in the range of 0.2 to 12.5 MPa$^{0.5}$ and $H_h$ in the range of 0.9 to 14.2 MPa$^{0.5}$. More preferred organic solvents comprise Hansen Solubility parameters of $H_d$ in the range of 18.5 to 21.0 MPa$^{0.5}$, $H_p$ in the range of 2.0 to 6.0 MPa$^{0.5}$ and $H_h$ in the range of 2.0 to 6.0 MPa$^{0.5}$.

TABLE 2

Hansen Solubility Parameters of useful solvents

| Solvent | $H_d$ [MPa$^{0.5}$] | $H_h$ [MPa$^{0.5}$] | $H_p$ [MPa$^{0.5}$] |
|---|---|---|---|
| 1,2,3,4-tetrahydro-1-naphthol | 19.6 | 9.2 | 12.8 |
| 1,2,3,4-tetrahydronaphthalene | 19.1 | 2.3 | 4.0 |
| 1,2,3,4-tetramethylbenzene | 18.7 | 1.8 | 1.6 |
| 1,2,3,5-tetramethylbenzene | 18.7 | 1.8 | 1.6 |
| 1,2,3-trimethylbenzene | 19.0 | 2.9 | 1.6 |
| 1,2,4,5-tetramethylbenzene | 18.7 | 1.8 | 1.6 |
| 1,2,4-trichlorobenzene | 20.5 | 6.9 | 2.7 |
| 1,2,4-trimethylbenzene | 19.0 | 2.9 | 1.6 |
| 1,2-dihydronaphthalene | 20.1 | 5.5 | 4.9 |
| 1,2-dimethylnaphthalene | 21.0 | 1.7 | 5.2 |
| 1,3,3-trimethyl-2-methyleneindole | 17.9 | 1.0 | 3.0 |
| 1,3-benzodioxole | 19.7 | 7.4 | 7.9 |
| 1,3-diisopropylbenzene | 17.5 | 0.2 | 1.1 |
| 1,3-dimethylnaphthalene | 21.0 | 1.7 | 5.2 |
| 1,4-benzodioxane | 19.5 | 8.7 | 7.2 |
| 1,4-diisopropylbenzene | 17.5 | 0.6 | 1.6 |
| 1,4-dimethylnaphthalene | 21.0 | 1.7 | 5.2 |
| 1,5-dimethyltetralin | 19.3 | 5.5 | 2.6 |
| 1-benzothiophene | 19.7 | 12.3 | 6.3 |
| 1-bromonaphthalene | 23.1 | 10.3 | 6.1 |
| 1-chloromethyl naphthalene | 22.1 | 9.9 | 5.3 |
| 1-ethylnaphthalene | 20.7 | 7.8 | 4.4 |
| 1-methoxynaphthalene | 21.4 | 10.5 | 7.5 |
| 1-methylnaphthalene | 21.7 | 8.4 | 4.5 |
| 1-methylindane | 19.4 | 5.7 | 2.5 |
| 1-methylindole | 19.2 | 8.1 | 10.2 |
| 2,3,3-trimethoxyindolenine | 19.6 | 6.8 | 4.2 |
| 2,3-benzofuran | 21.3 | 5.5 | 5.6 |
| 2,3-dihydrobenzofuran | 19.9 | 9.5 | 6.6 |
| 2,3-dimethylanisol | 18.9 | 4.6 | 4.5 |
| 2,4-dimethylanisol | 18.9 | 4.6 | 4.5 |
| 2,5-dimethylanisol | 18.9 | 4.6 | 4.5 |
| 2,6-diisopropyl naphthalene | 18.3 | 3.5 | 2.2 |
| 2,6-dimethylanisol | 18.9 | 4.6 | 4.5 |
| 2,6-dimethylnaphthalene | 20.1 | 5.0 | 3.0 |
| 2-bromo-3-bromomethyl)thiophene | 19.3 | 7.3 | 6.6 |
| 2-bromomethyl naphthalene | 22.0 | 9.4 | 7.2 |
| 2-bromonaphthalene | 23.1 | 10.3 | 6.1 |
| 2-ethoxynaphthalene | 20.5 | 10.0 | 7.0 |
| 2-ethylnaphthalene | 20.7 | 7.8 | 4.4 |
| 2-isopropylanisol | 17.7 | 4.3 | 5.4 |
| 2-methyl quinoline | 20.0 | 7.8 | 4.0 |
| 2-methylanisol | 18.3 | 5.1 | 6.2 |
| 2-methylindole | 17.8 | 9.7 | 4.8 |
| 2-phenoxyethanol | 18.7 | 8.5 | 13.0 |
| 3,4-dimethylanisol | 18.9 | 4.6 | 4.5 |
| 3,5-dimethylanisol | 18.9 | 4.6 | 4.5 |
| 3-bromoquinoline | 21.4 | 8.7 | 5.1 |
| 3-isopropylbiphenyl | 19.1 | 1.3 | 1.9 |
| 3-methylanisol | 18.7 | 5.7 | 5.4 |
| 4-benzylacetone | 18.3 | 8.8 | 5.0 |
| 4-isopropylbiphenyl | 19.0 | 2.5 | 1.9 |
| 4-methoxybenzyl alcohol | 19.0 | 8.5 | 13.3 |
| 4-methylanisol | 18.6 | 5.9 | 7.2 |

TABLE 2-continued

Hansen Solubility Parameters of useful solvents

| Solvent | $H_d$ [MPa$^{0.5}$] | $H_h$ [MPa$^{0.5}$] | $H_p$ [MPa$^{0.5}$] |
|---|---|---|---|
| 4-phenyl-2-butanone | 18.3 | 8.8 | 5.0 |
| 5,6,7,8-tetrahydro-1-naphthol | 19.6 | 7.2 | 10.9 |
| 5,6,7,8-tetrahydro-2-naphthol | 19.6 | 7.2 | 10.9 |
| 5,6,7,8-tetrahydro-2-naphthylamine | 20.1 | 7.9 | 8.6 |
| 5,6,7,8-tetrahydro-1-naphthylamine | 20.1 | 7.9 | 8.6 |
| 5-decanolide | 17.1 | 7.8 | 3.8 |
| 5-methoxyindan | 19.8 | 9.8 | 4.0 |
| 5-methoxyindole | 17.4 | 12.3 | 7.8 |
| 5-tert-butyl-m-xylene | 17.6 | 3.4 | 2.2 |
| 6-methoxy-1,2,3,4-tetrahydro-napthalene | 19.4 | 6.8 | 5.4 |
| 6-methyl quinoline | 21.7 | 8.4 | 4.5 |
| 8-methyl quinoline | 21.7 | 8.4 | 4.5 |
| Acetophenone | 18.8 | 10.8 | 5.5 |
| Anisole | 18.5 | 5.5 | 5.2 |
| α-pinene | 17.4 | 3.0 | 3.2 |
| Benzonitrile | 19.2 | 11.9 | 4.7 |
| Benzothiazole | 21.3 | 5.5 | 5.6 |
| benzyl acetate | 18.2 | 7.3 | 6.4 |
| benzyl alcohol | 19.1 | 6.7 | 14.2 |
| Bromobenzene | 19.8 | 7.6 | 4.3 |
| Butylbenzene | 17.6 | 2.6 | 1.7 |
| Butylbenzoate | 17.7 | 5.9 | 5.2 |
| Cyclohexylbenzene | 18.6 | 1.0 | 1.6 |
| Decahydronaphthalene | 17.5 | 0.4 | 1.0 |
| diphenyl ether | 19.9 | 2.9 | 3.3 |
| ethylphenylketon (propiophenone) | 18.3 | 8.9 | 5.3 |
| Ethylbenzene | 18.2 | 2.7 | 2.1 |
| Ethylbenzoate | 18.1 | 6.6 | 5.9 |
| furfuryl alcohol | 18.1 | 6.7 | 11.9 |
| gamma-terpinene | 18.0 | 2.5 | 2.8 |
| Hexylbenzene | 17.4 | 2.9 | 1.6 |
| Indane | 19.7 | 7.3 | 5.8 |
| Indene | 20.3 | 4.4 | 5.4 |
| iso-amylbenzene | 17.1 | 3.7 | 1.8 |
| iso-butylbenzene | 17.1 | 2.9 | 1.6 |
| isopropylbenzene (cumene) | 17.8 | 2.0 | 1.1 |
| m-cymene | 18.1 | 2.0 | 2.1 |
| Mesitylene | 19.0 | 2.9 | 1.6 |
| methyl benzoate | 18.5 | 7.9 | 6.4 |
| Methylphenylacetate | 18.2 | 7.3 | 6.4 |
| m-xylene | 18.8 | 3.1 | 2.7 |
| n-butoxybenzene | 17.5 | 4.4 | 4.1 |
| n-butylbenzene | 17.6 | 2.6 | 1.7 |
| n-propyl benzoate | 17.8 | 6.6 | 6.3 |
| n-propylbenzene | 17.8 | 3.4 | 2.8 |
| o-dichlorobenzene | 19.5 | 8.7 | 3.3 |
| o-diethylbenzenes | 17.7 | 0.7 | 1.9 |
| o-ethyltoluene | 18.0 | 1.9 | 2.8 |
| o-xylene | 18.4 | 2.0 | 2.9 |
| Pentylbenzene | 17.4 | 3.0 | 1.8 |
| p-ethyltoluene | 18.3 | 3.5 | 2.8 |
| Phenetol | 18.1 | 4.6 | 4.6 |
| phenyl acetate | 18.5 | 7.9 | 6.4 |
| p-isopropyltoluene (p-cymene) | 18.0 | 2.5 | 2.8 |
| Propiophenone | 18.3 | 8.9 | 5.3 |
| Propylbenzoate | 17.8 | 6.6 | 6.3 |
| p-xylene | 18.7 | 3.3 | 3.3 |
| sec-butylbenzene | 17.2 | 2.2 | 1.6 |
| t-butylbenzene | 17.2 | 1.3 | 2.9 |
| Tetralin | 19.1 | 2.3 | 4.0 |
| Thiophene | 18.8 | 5.2 | 7.4 |
| Toluene | 18.6 | 4.0 | 2.2 |
| Veratrole | 18.2 | 6.3 | 7.5 |

$H_d$ refers to Dispersion contribution
$H_p$ refers to Polar contribution
$H_h$ refers to Hydrogen bonding contribution Preferably the solvent has a boiling point or sublimation temperature of <300° C., more preferably ≤260° C., most preferably ≤220° C., at the pressure employed, very preferably at atmospheric pressure (1013 hPa). Evaporation can also be accelerated e.g. by applying heat and/or reduced pressure. Unexpected improvements can be achieved by using solvents having a boiling point of at least 100° C., preferably at least 130° C.

Usually, the organic solvent can comprise a surface tension of at least 28 mN/m, preferably at least 30 mN/m, more preferably at least 32 mN/m and most preferably at least 35 mN/m. The surface tension can be measured using a FTA (First Ten Angstrom) 125 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

For the purpose for making a rough estimate, the surface tension can be calculated using the Hansen Solubility Parameters by the formula expounded in Hansen Solubility Parameters: A User's Handbook, Second Edition, C. M. Hansen (2007), Taylor and Francis Group, LLC (HSPiP manual).

Surface tension=$0.0146 \times (2.28 \times \delta H_d^2 + \delta H_p^2 + \delta H_h^2) \times MVol^{0.2}$, where:

$H_d$ refers to Dispersion contribution
$H_p$ refers to Polar contribution
$H_h$ refers to Hydrogen bonding contribution
MVol refers to Molar Volume The Hansen Solubility Parameters can be determined according to the Hansen Solubility Parameters in Practice (HSPiP) program ($2^{nd}$ edition) as supplied by Hanson and Abbot et al.

Preferably, the solvent can comprise a relative evaporation rate (Butyl acetate=100) of at least 0.01, preferably of at least 0.1, preferably of at least 0.5, more preferably of at least 5, more preferably of at least 10 and most preferably of at least 20. The relative evaporation rate can be determined according to DIN 53170: 2009-08. For the purpose for making a rough estimate, the relative evaporation rate can be calculated using the Hansen Solubility Parameters with the HSPiP program as mentioned above and below.

Preferably, the inert binder increases the solvent viscosity by at least 0.4 cps when dissolving 1% w/w of the inert binder in said organic solvent.

The composition of the present invention can particularly comprise at least 70% by weight, preferably at least 80% by weight and more preferably at least 90% by weight of organic solvents.

The composition according to the present invention may additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors. However, these further components should not be oxidising or otherwise capable of chemically reacting with the organic light emitting materials and/or charge transport materials or have an electrically doping effect on the organic light emitting materials and/or charge transport materials.

Surprising improvements can be achieved with volatile wetting agents. The term "volatile" as used above and below means that the agent can be removed from the organic light emitting materials and/or charge transport materials by evaporation, after these materials have been deposited onto a substrate of an OLED device, under conditions (like temperature and/or reduced pressure) that do not significantly damage these materials or the OLED device. Preferably this means that the wetting agent has a boiling point or sublimation temperature of <350° C., more preferably ≤300° C., most preferably ≤250° C., at the pressure employed, very preferably at atmospheric pressure (1013 hPa). Evaporation can also be accelerated e.g. by applying heat and/or reduced pressure.

Surprising effects can be accomplished by compositions comprising volatile components having similar boiling points. Preferably, the difference of the boiling point of the wetting agent and the organic solvent is in the range of −50° C. to 50° C., more preferably in the range of −30° C. to 30° C. and most preferably in the range of −20° C. to 20° C.

Preferred wetting agents are non-aromatic compounds. With further preference the wetting agents are non-ionic compounds. Particular useful wetting agents comprise a surface tension of at most 35 mN/m, preferably of at most 30 mN/m, and more preferably of at most 25 mN/m. The surface tension can be measured using a FTA (First Ten Angstrom) 125 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

According to a special aspect of the present invention, the difference of the surface tension of the organic solvent and the wetting agent is preferably at least 1 mN/m, preferably at least 5 mN/m and more preferably at least 10 mN/m.

According to a special aspect of the present invention the wetting additive can comprise a relative evaporation rate (Butyl acetate=100) of at least 0.01, preferably of at least 0.1, preferably of at least 0.5, more preferably of at least 5, more preferably of at least 10 and most preferably of at least 20.

Unexpected improvements can be achieved with compositions comprising solvents and wetting agents having a similar relative evaporation rate (Butyl acetate=100). Preferably, the difference of the relative evaporation rate (Butyl acetate=100) of the wetting agent and the organic solvent is in the range of −20 to 20, more preferably in the range of −10 to 10. According to a preferred embodiment of the present invention, the ratio of the relative evaporation rate (Butyl acetate=100) of the wetting agent to relative evaporation rate (Butyl acetate=100) of the organic solvent can range from 230:1 to 1:230, preferably from 20:1 to 1:20 and more preferably from 5:1 to 1:5.

Unexpected improvements can be achieved by wetting agents comprising a molecular weight of at least 100 g/mol, preferably at least 150 g/mol, more preferably at least 180 g/mol and most preferably at least 200 g/mol. Suitable and preferred wetting agents that do not oxidise or otherwise chemically react with the OSC materials are selected from the group consisting of siloxanes, alkanes, amines, alkenes, alkynes, alcohols and/or halogenated derivates of these compounds. Furthermore, fluoro ethers, fluoro esters and/or fluoro ketones can be used. More preferably, these compounds are selected from methyl siloxanes having 6 to 20 carbon atoms, especially 8 to 16 carbon atoms; $C_7$-$C_{14}$ alkanes, $C_7$-$C_{14}$ alkenes, $C_7$-$C_{14}$ alkynes, alcohols having 7 to 14 carbon atoms, fluoro ethers having 7 to 14 carbon atoms, fluoro esters having 7 to 14 carbon atoms and fluoro ketones having 7 to 14 carbon atoms. Most preferred wetting agents are methylsiloxanes having 8 to 14 carbon atoms.

Useful and preferred alkanes having 7 to 14 carbon atoms include heptane, octane, nonane, decane, undecane, dodecane, tridecane, tetradecane, 3-methylheptane, 4-ethylheptane, 5-propyldecane, trimethylcyclohexane and decalin.

Halogenated alkanes having 7 to 14 carbon atoms include 1-chloroheptane, 1,2-dichlorooctane, tetrafluorooctane, decafluorododecane, perfluorononane, 1,1,1-trifluoromethyldecane, and perfluoromethyldecalin.

Useful and preferred alkenes having 7 to 14 carbon atoms include heptene, octene, nonene, 1-decene, 4-decene, undecene, dodecene, tridecene, tetradecene, 3-methylheptene, 4-ethylheptene, 5-propyldecene, and trimethylcyclohexene.

Halogenated alkenes having 7 to 14 carbon atoms include 1-chloroheptene, 1,2-dichlorooctene, tetrafluorooctene, decafluorododecene, perfluorononene, and 1,1,1-trifluoromethyldecene.

Useful and preferred alkynes having 7 to 14 carbon atoms include heptyne, octyne, nonyne, 1-decyne, 4-decyne, undecyne, dodecyne, tridecyne, tetradecyne, 3-methylheptyne, 4-ethylheptyne, 5-propyldecyne, and trimethylcyclohexyne.

Halogenated alkynes having 7 to 14 carbon atoms include 1-chloroheptyne, 1,2-dichlorooctyne, tetrafluorooctyne, decafluorododecyne, perfluorononyne, and 1,1,1-trifluoromethyldecyne.

Useful and preferred alcohols having 7 to 14 carbon atoms include 3,5-dimethyl-1-hexyn-3-ol, heptanol, octanol, nonanol, decanol, undecanol, dodecanol, tridecanol, tetradecanol, 3-methylheptanol, 4-ethylheptanol, 5-propyldecanol, trimethylcyclohexanol and hydroxyldecalin.

Halogenated alkanols having 7 to 14 carbon atoms include 1-chloroheptanol, 1,2-dichlorooctanol, tetrafluorooctanol, decafluorododecanol, perfluorononanol, 1,1,1-trifluoromethyldecanol, and 2-trifluoromethyl-1-hydroxydecalin.

Useful and preferred amines having 4 to 15 carbon atoms include hexylamine, tripropylamine, tributylamine, dibutylamine, piperazine, heptylamine, octylamine, nonylamine, decylamine, undecylamine, dodecylamine, tridecylamine, tetradecylamine, 3-methylheptylamine, 4-ethylheptylamine, 5-propyldecylamine, trimethylcyclohexylamine.

Halogenated amines having 4 to 15 carbon atoms include 1-chloroheptylamine, 1,2-dichlorooctylamine, tetrafluorooctylamine, decafluorododecylamine, perfluorononylamine, 1,1,1-trifluoromethyldecylamine, perfluorotributylamine, and perfluorotripentylamine.

Useful and preferred fluoro ethers having 7 to 14 carbon atoms include 3-ethoxy-1,1,1,2,3,4,4,5,5,6,6,6 dodecafluoro-2-trifluoromethyl-hexane, 3-propoxy-1,1,1,2,3,4,4,5,5,6,6,6 dodecafluoro-2-trifluoromethyl-hexane, 3-ethoxy-1,1,1,2,3,4,4,5,5,6,6,7,7,7 tetradecafluoro-2-trifluoromethyl-heptane, 3-ethoxy-1,1,1,2,3,4,4,5,5,5 decafluoro-2-trifluoromethyl-pentane, and 3-propoxy-1,1,1,2,3,4,4,5,5,5 decafluoro-2-trifluoromethyl-pentane.

Useful and preferred fluoro esters having 7 to 14 carbon atoms include 3-(1,1,1,2,3,4,4,5,5,6,6,6 dodecafluoro-2-trifluoromethyl-hexyl) ethanoate, 3-(1,1,1,2,3,4,4,5,5,6,6,6 dodecafluoro-2-trifluoromethyl-hexyl) propanoate, 3-(1,1,1,2,3,4,4,5,5,6,6,7,7,7 tetradecafluoro-2-trifluoromethyl-heptyl) ethanoate, 3-(1,1,1,2,3,4,4,5,5,5 decafluoro-2-trifluoromethyl-pentyl) ethanoate, and 3-(1,1,1,2,3,4,4,5,5,5 decafluoro-2-trifluoromethyl-pentyl) propanoate.

Useful and preferred fluoroketones having 7 to 14 carbon atoms include 3-(1,1,1,2,3,4,4,5,5,6,6,6 dodecafluoro-2-trifluoromethyl-hexyl)ethylketone, 3-(1,1,1,2,3,4,4,5,5,6,6,6 dodecafluoro-2-trifluoromethyl-hexyl) propylketone, 3-(1,1,1,2,3,4,4,5,5,6,6,7,7,7 tetradecafluoro-2-trifluoromethyl-heptyl)ethylketone, 3-(1,1,1,2,3,4,4,5,5,5 decafluoro-2-trifluoromethyl-pentyl)ethylketone, and 3-(1,1,1,2,3,4,4,5,5,5 decafluoro-2-trifluoromethyl-pentyl) propylketone.

Useful and preferred siloxanes include hexamethyldisiloxane, octamethyl-trisiloxane, decamethyltetrasiloxane, dodecamethylpentasiloxane, and tetradecamethylhexasiloxane.

Examples of compounds useful as wetting agents are disclosed in Table 3. The provided relative evaporation rate (RER) and surface tension values are calculated using the Hansen Solubility Parameters with the HSPiP program provided by Hanson and Abbott et al. as mentioned above and below.

sion can be achieved by selection the polymeric binder and the solvent in an appropriate manner. The use of the Hanson Solubility Parameters as mentioned above provides a useful aid for a person skilled in the art. Furthermore, the surface tension can be achieved by using a wetting agent, preferably a volatile wetting agent as mentioned above.

TABLE 3

Preferred wetting agents

| Wetting agent | Boiling point [° C.] | $H_d$ [MPa$^{0.5}$] | $H_h$ [MPa$^{0.5}$] | $H_p$ [MPa$^{0.5}$] | $M_{Vol}$ | RER | Surface tension [mN/m] |
|---|---|---|---|---|---|---|---|
| Decane | 174 | 15.5 | 0 | 0 | 194 | 19.9 | 23.0 |
| 3-Octanol | 175 | 15.5 | 6 | 10 | 159.3 | 2.2 | 27.5 |
| 1-Decene | 169 | 15.5 | 1.5 | 2.3 | 188.4 | 13.9 | 23.1 |
| 1-Octyn-3-ol | 195 | 15.5 | 8.8 | 10.2 | 147 | 2.6 | 28.9 |
| 4-Octyne | 129 | 14.6 | 0 | 2.6 | 148.3 | 81.8 | 19.6 |
| 1-Decyne | 174 | 15.5 | 0.1 | 3.3 | 181.4 | 15.1 | 23.1 |
| 1-Dodecyne | 215 | 15.7 | 0.1 | 3.3 | 213.5 | 1.4 | 24.5 |
| Perfluorononane | 125 | 13.3 | 0 | −0.3 | 283.6 | 393.1 | 18.2 |
| Hexamethyl disiloxane | 128 | 13 | 1.5 | 0.8 | 207.2 | 505.2 | 16.5 |
| Octamethyl trisiloxane | 153 | 12.6 | 1.5 | 0.4 | 283.4 | 56 | 16.5 |
| Decamethyl tetrasiloxane | 194 | 12.3 | 1.4 | 0.1 | 359.7 | 7.4 | 16.4 |
| Dodecamethy pentasiloxane | 230 | 12 | 1.3 | −0.1 | 436 | 1.1 | 16.2 |
| Perfluoromethyl decalin | 150 | 11.8 | 0 | 1.2 | 275.8 | 16.6 | 14.3 |
| 3,5 Dimethyl-1-hexyn-3-ol | 160 | 15.2 | 5.5 | 13.2 | 145.7 | 0.8 | 28.9 |
| 3-Ethoxy-1,1,1,2,3,4,4,5,5,6,6,6 dodecafluoro-2-trifluoromethyl-hexane | 128 | 13.2 | 2.7 | 1.8 | 266.9 | 1946 | 18.2 |
| Perfluorotributyl amine | 174 | 12.9 | 0 | 0 | 383.3 | 0.2 | 18.2 |
| Perfluorotripentyl amine | 215 | 13.2 | 0 | 0 | 462.7 | <0.1 | 19.8 |
| Tripropylamine | 156 | 15.5 | 3.9 | 2.1 | 189 | 28.6 | 23.6 |
| Tributylamine | 216 | 15.7 | 2.1 | 1.7 | 240.4 | 2.2 | 24.9 |
| dibutylamine | 159 | 15.3 | 2.2 | 4.4 | 171.0 | 22.4 | 22.8 |
| Hexylamine | 132 | 15.7 | 5.0 | 9.3 | 132.1 | 30.5 | 26.1 |
| Piperazine | 145 | 16.9 | 4.4 | 6.7 | 97 | 22.8 | 26.1 |

$H_d$ refers to Dispersion contribution
$H_p$ refers to Polar contribution
$H_h$ refers to Hydrogen bonding contribution
$M_{Vol}$ refers to Molar Volume.

Preferably, the composition comprises at most 5% by weight, more preferably at most 3% by weight of wetting additives. More preferably, the composition comprises 0.01 to 4% by weight, preferably 0.1 to 1% by weight of wetting agent.

Preferably, the solvent should be selected such that it can be evaporated from the coated or printed layer comprising the OSC materials together with the wetting agent, preferably in the same processing step. The processing temperature used for removing the solvent and the volatile additive should be selected such that the layer, comprising the organic light emitting materials and/or charge transport materials, is not damaged. Preferably the deposition processing temperature is from room temperature (RT; about 25° C.) to 135° C. and more preferably from RT to 80° C.

Preferably, the composition of the present invention comprises a surface tension in the range of 20 to 60 mN/m, more preferably 25 to 45 mN/m. The surface tension can be measured using a FTA (First Ten Angstrom) 125 contact angle goniometer as mentioned above and below. The surface ten- Preferably, the composition has a viscosity in the range of 1.5 to 100 mPas, preferably in the range of 2.0 to 40 mPas, more preferably in the range of 2.1 to 20 mPas and most preferably in the range of 2.1 to 15 mPas. The viscosity is determined at a temperature of 25° C. by measuring on AR-G2 rheometer manufactured by TA Instruments. This is measured using a parallel plate geometry.

Preferably, the composition can be filtered e.g. to 1 micron or less.

During the process of preparing an OLED device, the layer, comprising the organic light emitting materials and/or charge transport materials, is deposited onto a substrate, followed by removal of the solvent together with any volatile conductive additive(s) present, to form a film or layer.

The substrate can be any substrate suitable for the preparation of OLED devices, or can also be the OLED device, or a part thereof. Suitable and preferred substrates are e.g. glass, ITO coated glass, ITO glass with pre coated layers including PEDOT, PANI etc, flexible films of polyethylene terephthalate (PET), polyethylene naphthalate (PEN), polyimide, and flexible films with ITO, or other conducting layers and barrier layers e.g. Vitex film.

Deposition of the layer, comprising the organic light emitting materials and/or charge transport materials, can be achieved by standard methods that are known to the skilled person and are described in the literature. Suitable and preferred deposition methods include liquid coating and printing techniques. Very preferred deposition methods include, without limitation, dip coating, spin coating, ink jet printing, nozzle printing, letter-press printing, screen printing, gravure printing, doctor blade coating, roller printing, reverse-roller printing, offset lithography printing, flexographic printing, web printing, spray coating, curtain coating, brush coating, airbrush coating, slot dye coating or pad printing. Gravure, flexographic and inkjet printing are especially preferred.

Removal of the solvent and any volatile conductive additive(s) is preferably achieved by evaporation, for example by exposing the deposited layer to high temperature and/or reduced pressure, preferably at 50 to 200° C., more preferably at 60 to 135° C.

The thickness of the layer, comprising the organic light emitting materials and/or charge transport materials, is preferably from 1 nm to 500 nm, more preferably from 2 to 150 nm.

Further to the materials and methods as described above and below, the OLED device and its components can be prepared from standard materials and standard methods, which are known to the person skilled in the art and described in the literature.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

The term "polymer" includes homopolymers and copolymers, e.g. statistical, alternating or block copolymers. In addition, the term "polymer" as used hereinafter does also include oligomers and dendrimers. Dendrimers are typically branched macromolecular compounds consisting of a multifunctional core group onto which further branched monomers are added in a regular way giving a tree-like structure, as described e.g. in M. Fischer and F. Vögtle, *Angew. Chem., Int. Ed.* 1999, 38, 885.

The term "conjugated polymer" means a polymer containing in its backbone (or main chain) mainly C atoms with $sp^2$-hybridisation, or optionally sp-hybridisation, which may also be replaced by hetero atoms, enabling interaction of one π-orbital with another across an intervening σ-bond. In the simplest case this is for example a backbone with alternating carbon-carbon (or carbon-hetero atom) single and multiple (e.g. double or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings) consisting of C atoms or hetero atoms with $sp^2$-hybridisation or sp-hybridisation. See also "IUPAC Compendium of Chemical terminology, Electronic version".

Unless stated otherwise, the molecular weight is given as the number average molecular weight $M_n$ or as weight average molecular weight $M_w$, which unless stated otherwise are determined by gel permeation chromatography (GPC) against polystyrene standards.

The degree of polymerization (n) means the number average degree of polymerization, unless stated otherwise given as $n=M_n/M_U$, wherein $M_U$ is the molecular weight of the single repeating unit.

The term "small molecule" means a monomeric, i.e. a non-polymeric compound.

Unless stated otherwise, percentages of solids are per cent by weight ("wt. %"), percentages or ratios of liquids (like e.g. in solvent mixtures) are per cent by volume ("vol. %"), and all temperatures are given in degrees Celsius (° C.).

Unless stated otherwise, concentrations or proportions of mixture components, like the conductive additives, given in percentages or ppm are related to the entire formulation including the solvents.

The invention will now be described in more detail by reference to the following examples, which are illustrative only and do not limit the scope of the present invention.

WORKING EXAMPLES

Comparative Example 1

A printing ink was prepared by mixing a phosphorescent compound according to formula 107

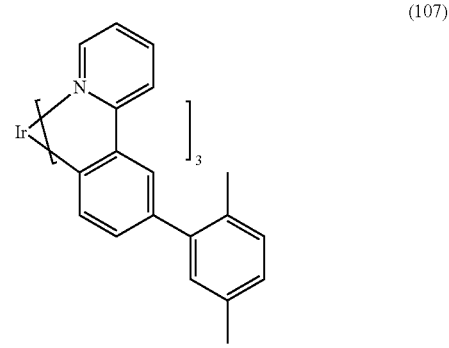

(107)

and a host material having the formula 141

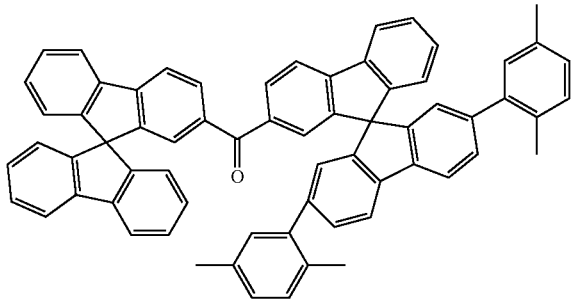

(141)

in a weight ratio of 1:4 (phosphorescent compound 107: host material 141) and solving the mixture obtained in 3,4-dimethylanisole (3,4-DMA). The concentration of the semiconducting compounds was about 1.6% by weight.

The OLED inks was ink jet printed using a Dimatix DMP 2800 printer on glass substrates (30 mm wide) covered with a 4 pixels structure of ITO, a PEDOT layer and HIL-012 layer. 6 mm squares were printed using 15, 20, 35 and 40 drop spacing (ds). Two drying procedures were used, a hot plate at 100° C. and vacuum at room temperature to assess the differences in film quality.

The HIL-012 layer did not wet or the swaths merge when using 35 and 40 ds. The printing performed better using 15 and 20 ds with better wetting but drying fronts seen on the film.

Example 1

Essentially, Comparative Example 1 was repeated. However, an inert polymeric binder has been added to the printing ink. The printing ink comprised 0.4% by weight polystyrene having a weight average molecular weight of 200,000 g/mol (as supplied by Sigma Aldrich) and 1.6% by weight of the semiconducting compounds as mentioned in Comparative Example 1.

The HIL-012 layer was wetted acceptable for 25-40 ds and not all the swaths merge after printing. However, the results are improved in comparison to the Comparative example.

Example 2

Essentially, Comparative Example 1 was repeated. However, an inert polymeric binder and a wetting agent have been added to the printing ink. The printing ink comprised 0.4% by weight polystyrene having a weight average molecular weight of 200,000 g/mol (as supplied by Sigma Aldrich), 1% by weight 3-ethoxy-1,1,1,2,3,4,4,5,5,6,6,6-dodecafluoro-2-trifluoromethyl-hexane (HFE 7500 commercially available from 3M™ NOVEC™ Engineered Fluid) and 1.6% by weight of the semiconducting compounds as mentioned in Comparative Example 1.

A good wetting of the HIL-012 layer was achieved. Nevertheless, small pinholes are visible on the layers for 20 ds and above. However, the results are improved in comparison to the Example 1.

Example 3

Essentially, Comparative Example 1 was repeated. However, an inert polymeric binder and a wetting agent have been added to the printing ink. The printing ink comprised 0.4% by weight polystyrene having a weight average molecular weight of 200,000 g/mol (as supplied by Sigma Aldrich), 1% by weight ethoxylated acetylenic diol (Dynol™ 604 commercially available from Air Products Inc.) and 1.6% by weight of the semiconducting compounds as mentioned in Comparative Example 1.

A good wetting of the HIL-012 layer was achieved. The results are improved in comparison to the Example 1.

Example 4

Essentially, Comparative Example 1 was repeated. However, an inert polymeric binder has been added to the printing ink. The printing ink comprised 0.4% by weight polystyrene having a weight average molecular weight of 382,000 g/mol (as supplied by Sigma Aldrich) and 1.6% by weight of the semiconducting compounds as mentioned in Comparative Example 1.

A very good film quality and wetting on HIL-012 after drying warm or in a vacuum had been achieved. The results are improved in comparison to the Example 1.

Example 5

Essentially, Comparative Example 1 was repeated. However, an inert polymeric binder has been added to the printing ink. The printing ink comprised 0.4% by weight polystyrene having a weight average molecular weight of 560,000 g/mol (as supplied by Sigma Aldrich) and 1.6% by weight of the semiconducting compounds as mentioned in Comparative Example 1.

A good film quality and wetting on HIL-012 after drying has been achieved. The results are improved in comparison to the Example 1. However, some coffee staining has been observed.

Device Examples 6 to 13

Device Preparation of Solution-Processed OLEDs

There are already many examples in the literature about the preparation of organic light emitting diodes from solution, mostly for polymer devices ("PLEDs", e. g. WO 2004/037887 A2). To illustrate that the resulting devices from the present invention were not only leading to better films but also perform well, OLED devices were made in a standard test setup. The typical setup is depicted in FIG. 1, the used device layout is shown in FIG. 2 (left: ITO-structure, right: complete electronic layout with ITO, cathode and optional metallization of leads to the pixels). ITO (Indium-Tin-Oxide) is a transparent, hole injecting anode that was deposited onto sodalime glass by sputtering and structured to obtain 4, 2×2 mm pixels. In the present case the substrates were commercially obtained from Technoprint, but any other supplier or design will work just as well.

The substrates are cleaned in a cleanroom environment with DI water and an industrial detergent (Deconex 15 PF). The surface is then activated with a UV/ozone plasma-treatment. As a first. layer 80 nm PEDOT are spin-coated onto the substrate and dried for 10 minutes at 180° C. (PEDOT is a water-based dispersion of PEDOT, a polythiophene, and PSSH, polysulfonic-acid, available from H. C. Starck, Goslar; used here is Clevios P 4083 Al, but other PEDOT-products from H. C. Starck or "buffer" materials from other suppliers will work as well.) The thus prepared substrates are then transferred into an inert atmosphere (an argon or nitrogen filled glovebox) where 20 nm of an interlayer are spin-coated. Typically such an interlayer is a hole-transport polymer, and any commercially available interlayer, often also called HTL, can be used to make devices with the materials from this invention. In the present examples HIL-012 from Merck is coated from a 5 g/l solution in toluene. The films are annealed for 60 minutes at 180° C. before the emission layer (EML) is spin-coated on top. The film thickness of the EML is 80 nm, and the substrates are annealed again for 10 minutes at 180° C. to remove remaining solvent. The solid concentrations and the spin-rates vary with the viscosity of the solution, i. e. with the small molecule and binder contents. In the following examples, toluene is used as the solvent, but other solvents (see specification) can be used as well. In this case, the spin-coating conditions and drying procedures have to be adjusted accordingly.

To make electrical contact a cathode structure is vacuum deposited through a metal mask on top of the organic films. The cathode may consist of just one metal (e.g. Yb), be a two-layer structure of a reactive and thus electron injecting metal (such as Mg, Ba, Sr, etc.) in combination with a capping metal (typically Al or Ag), be a two- or three-layer structure containing an alkali or earth alkali fluoride or oxide as the first deposited layer (e.g. LiF, $Li_2O$, $BaF_2$, BaO, MgO, NaF, etc.), or have one or more vacuum deposited electron transport layers followed by the right electron injection metal or metal fluoride, oxide or quinolate. In the present case only Ba and Al are deposited to keep the devices simple and show that even such a simple setup can render very good devices. To close the organic and cathode structure against moisture and oxygen the devices are encapsulated and can then be handled outside the glovebox.

Characterization is done with a setup as in FIG. 3. The devices are fixed in a sample holder with spring-contacts connecting anode and cathode to the measurement circuit. A photodiode with an eye-correction filter is put tightly on top to prevent outside light from falsifying the results. Then the voltage is increased stepwise to 20 V in steps of 0.2 V while the current through the sample and the photocurrent from the photodiode are measured. This way the so-called IVL-data (current, voltage, luminance) are collected. Important data are the maximum efficiency (in cd/A), the external quantum efficiency (EQE) in %, and the required voltage for a certain brightness. To determine the EL spectrum and color coordinates, the photodiode can be replaced by a fiber optics coupler that leads to an Ocean Optics spectrometer. Spectra are typically measured at a specific brightness (100 or 1000 cd/m$^2$) and translated into color coordinates in the CIE system (CIE: Commission International de l'Éclairage, standard observer 1931).

In order to judge whether the materials used in the device are really useful in a display or lighting application, the lifetime of the devices is also very important. Lifetimes are typically measured from a starting brightness and defined as the time until half of the initial luminance has been reached. Since lifetimes of more than 1000 hours are difficult to measure, the starting brightness is usually increased and the lifetimes are extrapolated to the relevant brightness. The extrapolation factor for the devices here is 1.9.

Examples 6 to 13

Comparison of Devices With and Without PS as Binder

Example 6 (Comparison)

The compounds 107 and 141 were dissolved in toluene at a concentration of 24 g/l (4 g/l compound 107, 20 g/l compound 141) and spin-coated onto HIL-012-layers at a spin-rate of 1540 rpm. The results from the device characterization are contained in table 1.

Example 7 (Comparison)

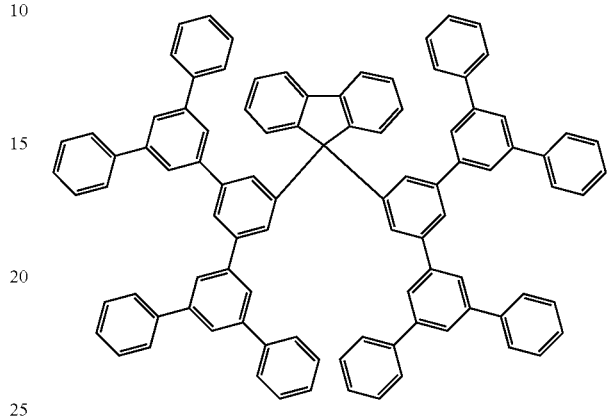

(142)

The compounds 107, 141, and 142 were dissolved in toluene at a concentration of 24 g/l (4 g/l compound 107, 10 g/l compound 141, and 10 g/l compound 142) and spin-coated onto HIL-012-layers at a spin-rate of 1940 rpm. In this composition compound 107 has the highest occupied molecular orbital (HOMO) of all compounds, compound 141 the lowest unoccupied molecular orbital (LUMO) of all compounds. Compound 142 is thus a wide-bandgap component just as the binders. The results from the device characterization are contained in table 1.

Example 8

The compounds 107 and 141 and polystyrene (135 000 g/mol, Aldrich) were dissolved in toluene at a concentration of 25 g/l (4 g/l compound 107, 16 g/l compound 141, and 5 g/l PS) and spin-coated onto HIL-012-layers at a spin-rate of 2230 rpm. The higher spin-rate to obtain 80 nm reflects the increased viscosity of the solution. The results from the device characterization are contained in table 1.

Example 9

The compounds 107 and 141 and polystyrene (200 000 g/mol, Alfa-Aesar) were dissolved in toluene at a concentration of 25 g/l (4 g/l compound 107, 16 g/l compound 141, and 5 g/l PS) and spin-coated onto HIL-012-layers at a spin-rate of 3000 rpm. The higher spin-rate to obtain 80 nm reflects the increased viscosity of the solution, also in comparison to example 7 where a lower Mw-PS was used. The results from the device characterization are contained in table 1.

TABLE 1

| Ex. | $U_{(100\ cd/m^2)}$ [V] | Max. Eff. [cd/A] | Max. Eff. [EQE] | CIE [x/y] | Lifetime @1000 cd/m$^2$ [h] |
| --- | --- | --- | --- | --- | --- |
| 6 | 4.3 | 21.8 | 6.2% | 0.35/0.61 | 2200 |
| 7 | 4.9 | 32.5 | 9.1% | 0.34/0.62 | 2080 |
| 8 | 4.0 | 27.2 | 7.8% | 0.34/0.61 | 4750 |
| 9 | 4.2 | 27.2 | 7.8% | 0.34/0.61 | 4000 |

The results show that long-lived devices can be made with a neutral binder in the EML. The initial electronic properties were also generally better (except for the efficiency in example 7.)

Example 10 (Comparison)

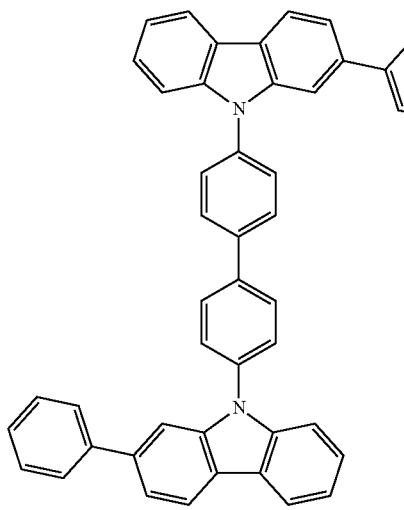

(143)

The compounds 107, 141, 142 and 143 were dissolved in warm chlorobenzene (70° C.) at a concentration of 24 g/l (4 g/l compound 107, 7.5 g/l compound 141, 7.5 g/l compound 143, and 5 g/l compound 142) and spin-coated onto HIL-012-layers at a spin-rate of 1390 rpm. In this composition compound 107 has the highest occupied molecular orbital (HOMO) of all compounds, compound 141 the lowest unoccupied molecular orbital (LUMO) of all compounds. Compound 142 is thus a wide-bandgap component just as the binders. Compound 143 is a typical co-host molecule in triplet devices. The results from the device characterization are contained in table 2.

Example 11

Compounds 107, 141, 143 and PS (200 000 g/mol, Alfa-Aesar) were dissolved in chlorobenzene at a concentration of 24 g/l (4 g/l compound 107, 7.5 g/l compound 141, 7.5 g/l compound 143, and 5 g/l PS) and spin-coated onto the HIL-012-layer at a spin-rate of 1490 rpm. The results are compared to example 10 in table 2.

TABLE 2

| Ex. | $U_{(100\ cd/m^2)}$ [V] | Max. Eff. [cd/A] | Max. Eff. [EQE] | CIE [x/y] | Lifetime @1000 cd/m² [h] |
|---|---|---|---|---|---|
| 10 | 4.0 | 23.5 | 6.5% | 0.33/0.62 | 2600 |
| 11 | 4.8 | 31.2 | 8.6% | 0.33/0.63 | 3300 |

The examples 10 and 11 show that the processability of the EML-solution was improved by the binder and that the binder containing devices (example 11) nevertheless had a better efficiency and lifetime as compared to non binder containing devices (example 10).

Example 12 (Comparison)

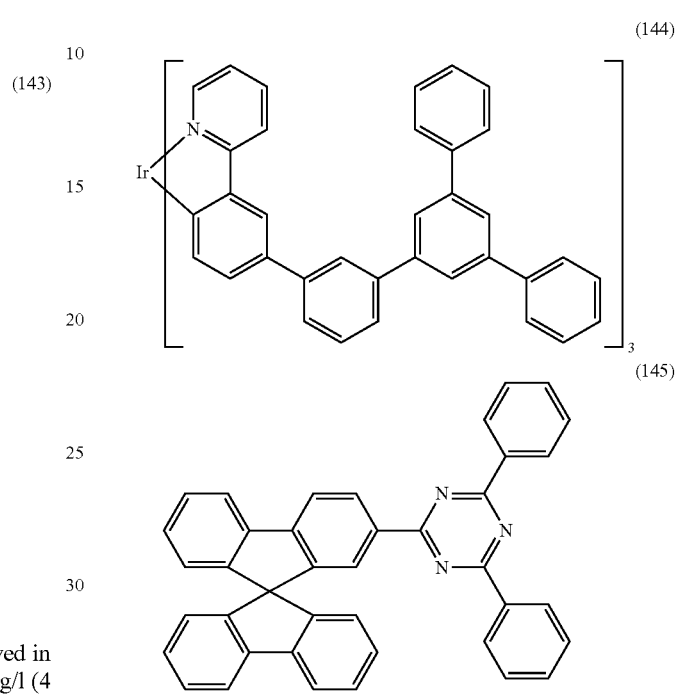

(144)

(145)

Compounds 144, 145, and 142 were dissolved in toluene at a concentration of 25 g/l (5 g/l compound 144, 10 g/l compound 145, and 10 g/l compound 142) and spin-coated onto the HIL-012-layer at a spin-rate of 1920 rpm. The results of the device evaluation are summarized in table 3.

Example 13

Compounds 144, 145, 142 and PS (200 000 g/mol, Alfa-Aesar) were dissolved in toluene at a concentration of 25 g/l (5 g/l compound 144, 10 g/l compound 145, 5 g/l compound 142 and 5 g/l PS) and spin-coated onto the HIL-012-layer at a spin-rate of 2100 rpm. In this device a small molecule wide-band-gap material was replaced by the wide-band-gap binder as it is done to change just the rheological properties of the solution. The results of the device evaluation are summarized in table 3. FIG. 4 shows the lifetime curves for the devices of examples 12 and 13. The curves show clearly that the difference in lifetime in the extrapolation is no significant difference as it is the noise in "better" device at the end that leads to a slightly better value. Replacing part of a wide-band-gap small molecule component in the EML by a neutral polymeric binder such as PS to improve rheological properties thus has no negative impact on device performance, even in very long lived devices.

TABLE 3

| Ex. | $U_{(1000\ cd/m^2)}$ [V] | Max. Eff. [cd/A] | Max. Eff. [EQE] | CIE [x/y] | Lifetime @1000 cd/m² [h] |
|---|---|---|---|---|---|
| 12 | 5.7 | 28.9 | 8.3% | 0.33/0.62 | 50000 |
| 13 | 5.6 | 30.3 | 8.0% | 0.34/0.62 | 48000 |

The invention claimed is:

1. A composition comprising one or more organic light emitting materials and/or charge transport materials having a molecular weight of at most 5000 g/mol, one or more organic solvents, and one or more polymers, wherein said polymer is an inert binder which does not have semiconducting properties and wherein the weight ratio of the one or more polymers to the one or more light emitting materials and/or charge transport materials is in the range of 1:2 to 1:5.

2. The composition according to claim 1, wherein said composition comprises a surface tension in the range of 20 mN/m to 60 mN/m.

3. The composition according to claim 1, wherein said inert binder is a polymer comprising repeating units derived from styrene monomers and/or olefins.

4. The composition according to claim 1, wherein said inert binder is a polymer having a weight average molecular weight of at least 100,000 g/mol.

5. The composition according to claim 1, wherein the composition comprises a viscosity at 25° C. in the range of 1.5 to 100 mPas.

6. The composition according to claim 1, wherein the inert binder is a polymer having a glass transition temperature in the range of −70 to 160° C.

7. The composition according to claim 1, wherein said composition comprises in the range of 0.25 to 5% by weight of said inert binders.

8. The composition according to claim 1, wherein said organic solvent is an aromatic compound.

9. The composition according to claim 8, wherein said organic solvent is selected from the group consisting of aromatic ethers, aromatic esters, aromatic ketones, heteroaromatic solvents and aniline derivatives.

10. The composition according to claim 1, wherein said organic solvent comprises a boiling point of at most 260° C.

11. The composition according to claim 1, wherein said composition comprises at least 80% by weight of said organic solvents.

12. The composition according to claim 1, wherein more organic light emitting materials and/or charge transport materials having a molecular weight of at most 5,000 g/mol is an organic phosphorescent compound which emits light and in addition contains at least one atom having an atomic number greater than 38.

13. The composition according to claim 12, wherein the phosphorescent compound is a compound of formulae (1) to (4):

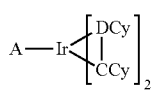

formula (1)

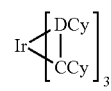

formula (2)

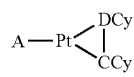

formula (3)

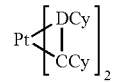

formula (4)

where

DCy is, identically or differently on each occurrence, a cyclic group which contains at least one donor atom, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand;

$R^1$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^2$—, —$CONR^2$—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^1$ radicals, and a plurality of substituents $R^1$, either on the same ring or on the two different rings, may together in turn form a mono- or polycyclic, aliphatic or aromatic ring system; and $R^2$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or —C≡C— and in which one or more hydrogen atoms may be replaced by F, or an aryl or heteroaryl group which has from 4 to 14 carbon atoms and may be substituted by one or more nonaromatic $R^1$ radicals.

14. The composition according to claim 13, wherein

DCy is, identically or differently on each occurrence, a cyclic group which contains at least nitrogen, carbon in the form of a carbene or phosphorus, via which the cyclic group is bonded to the metal, and which may in turn carry one or more substituents $R^1$; the groups DCy and CCy are connected to one another via a covalent bond; and A is a diketonate ligand.

15. The composition according to claim 1, wherein the composition comprises 0.5 to 5% by weight organic light emitting materials and/or charge transport materials having a molecular weight of at most 5000 g/mol.

16. A coating or printing ink for the preparation of OLED device which comprises the composition according to claim 1.

17. An OLED device prepared from the composition according to claim 1.

* * * * *